(12) United States Patent
Muramatsu et al.

(10) Patent No.: US 7,741,708 B2
(45) Date of Patent: Jun. 22, 2010

(54) SEMICONDUCTOR DEVICE

(75) Inventors: Shuichi Muramatsu, Numazu (JP);
Hidetoshi Suzuki, Numazu (JP);
Tomoyuki Sato, Numazu (JP); Kazuo Hara, Numazu (JP); Motoki Yamazaki, Numazu (JP); Masaki Asari, Numazu (JP); Hirofumi Yamaguchi, Numazu (JP)

(73) Assignee: Kokusan Denki Co., Ltd., Shizuoka (JP)

( * ) Notice: Subject to any disclaimer, the term of this patent is extended or adjusted under 35 U.S.C. 154(b) by 358 days.

(21) Appl. No.: 11/813,034

(22) PCT Filed: Dec. 9, 2005

(86) PCT No.: PCT/JP2005/022622

§ 371 (c)(1),
(2), (4) Date: Jan. 18, 2008

(87) PCT Pub. No.: WO2006/070581

PCT Pub. Date: Jul. 6, 2006

(65) Prior Publication Data

US 2008/0290477 A1 Nov. 27, 2008

(30) Foreign Application Priority Data

Dec. 28, 2004 (JP) ............................. 2004-379794

(51) Int. Cl.
*H01L 23/48* (2006.01)
(52) U.S. Cl. ...................... 257/690; 257/687; 257/787; 257/666
(58) Field of Classification Search ................. 257/666, 257/E23.031, E23.01, 676, 672, 787, 685, 257/687, 690, 692–695, 698
See application file for complete search history.

(56) References Cited

U.S. PATENT DOCUMENTS 6,373,078 B1 * 4/2002 Yea ............................. 257/81

FOREIGN PATENT DOCUMENTS

| JP | 01238152 | 9/1989 |
| JP | 05299456 | 11/1993 |
| JP | 11031775 | 2/1999 |

OTHER PUBLICATIONS

International Search Report for Application No. PCT/JP2005/022622.

* cited by examiner

*Primary Examiner*—Leonardo Andújar
(74) *Attorney, Agent, or Firm*—Pearne & Gordon LLP

(57) ABSTRACT

A semiconductor device having a plurality of semiconductor chips mounted on a lead frame (10) and required portions covered with seal portions in which: the plurality of semiconductor chips are divided into a first group of semiconductor chips (Dx to Dz) and a second group of semiconductor chips (Du to Dw and Thx to Thz); both groups of semiconductor chips are mounted on the lead frame (10) at a distance from each other; the seal portions are comprised of first and second resin-seal portions (41 and 42) which cover the first and second groups of semiconductor chips, respectively, along with required portions of the lead frame; both resin-seal portions are mechanically coupled with each other by coupling portions; and a group of read terminals respectively connected to circuits within the first resin-seal portion and circuits within the second resin-seal portion are led out through a gap between the first resin-seal portion (41) and the second resin-seal portion (42).

4 Claims, 11 Drawing Sheets

Fig. 5A
Fig. 5B
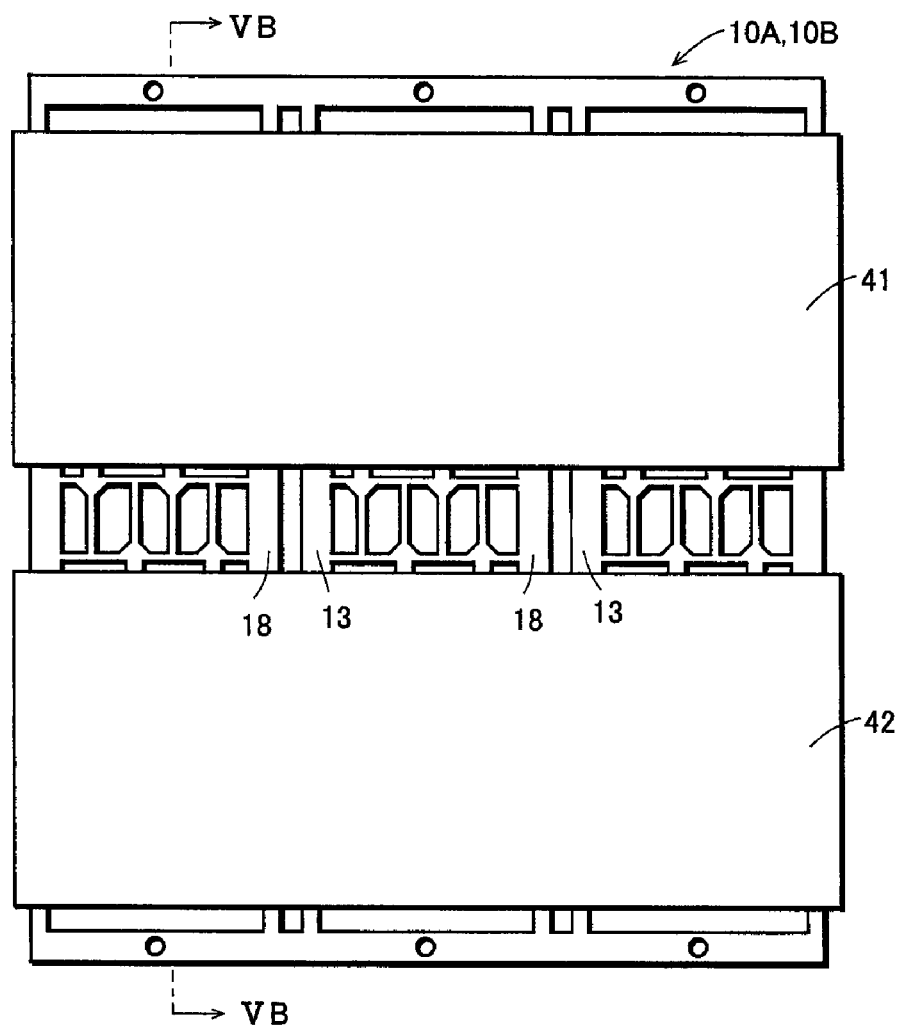
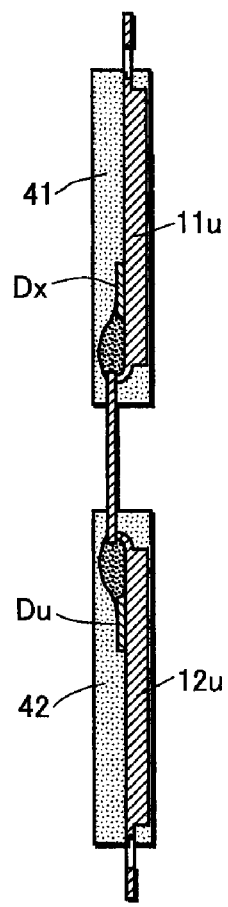

Fig. 10A Iu
Fig. 10B Iv
Fig. 10C Iw
Fig. 10D OUTPUT CURRENT WHEN THYRISTORS ARE OFF
Fig. 10E OUTPUT CURRENT WHEN THYRISTORS ARE ON
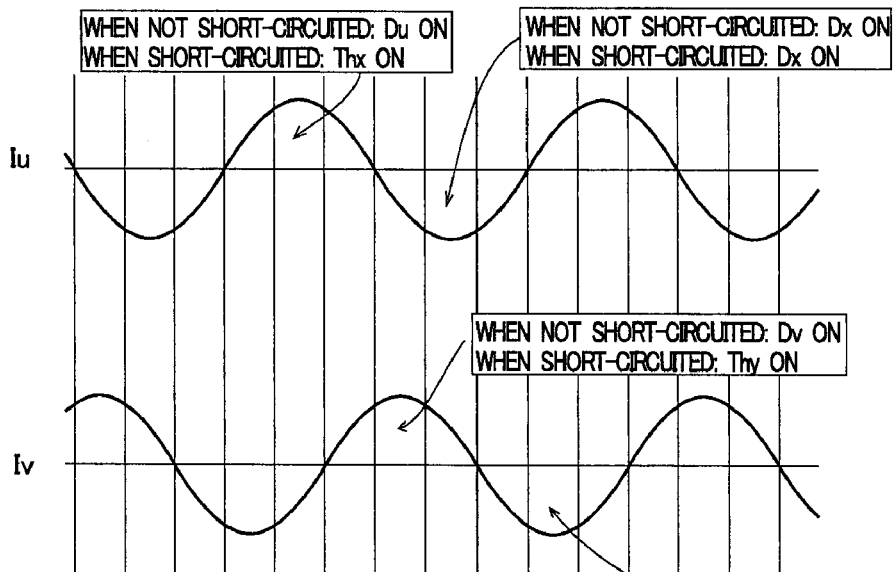
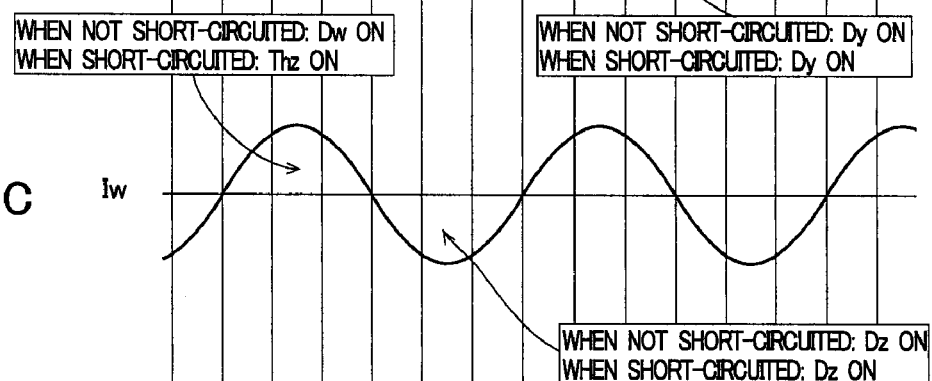

SEMICONDUCTOR DEVICE

TECHNICAL FIELD OF THE INVENTION

The present invention relates to a semiconductor device having a structure that a plurality of semiconductor chips are mounted on a lead frame and the plurality of semiconductor chips and required portions of the lead frame to be covered are covered with seal portions.

PRIOR ART OF THE INVENTION

In a semiconductor device where a predetermined circuit is comprised using a plurality of semiconductor chips, the plurality of semiconductor chips are mounted on an island of a lead frame, and each semiconductor chip and the inner leads of the lead frame are connected to each other using wires or the like. In addition, seal portions made of a resin-molded material are formed so as to cover the islands of the lead frame, the semiconductor chips mounted on the islands and the inner leads, in order to safeguard the semiconductor chips and the wired parts.

This type of semiconductor device is used in a variety of fields. For example, in the field of devices for supplying electric power from a power source, such as an electric generator, to a load and devices for controlling electric power to be supplied to the load, there is used a semiconductor device having a structure in which semiconductor chips are mounted on a lead frame and predetermined parts are sealed by resin-seal portions, for comprising a power circuit (a circuit where a large current flows), such as a rectifier circuit, an inverter circuit or a voltage regulator circuit comprised of semiconductor chips including power elements, such as diodes, thyristors, transistors, MOSFETs and the like. A semiconductor device comprising a power circuit is disclosed in, for example, Japanese Patent Application Laid-Open No. 2000-196009 and Japanese Patent Application Laid-Open No. 2004-63688.

A lead frame used for a semiconductor device comprising a power circuit is such that islands serving also as heat sinks and a plurality of leads to be electrically connected to the terminals of semiconductor chips are formed by punching out a relatively thick plate made of a conductive material. When a semiconductor device comprising a power circuit is comprised using this lead frame, a semiconductor chip, such as a power element, is first mounted on each island of the lead frame by soldering or adhesion and then the semiconductor chip and predetermined leads are connected to each other through wires. Next, islands and inner leads, among the portions of the lead frame, which are required portions to be covered, and the semiconductor chips are covered with a resin to form resin-seal portions (resin packages) and unnecessary portions of the lead frame external to these resin-seal portions are cut off, thus obtaining a semiconductor device having a structure that outer leads are drawn out of the resin-seal portions as lead terminals.

Conventionally used lead frames include those where all of a plurality of leads to be drawn out are arranged in an array on one side of the lead frame in its width direction, as disclosed in Japanese Patent Laid-Open No. 2000-196009, and those where a plurality of leads to be drawn out are grouped and arranged on both sides of the lead frame in its width direction, as disclosed in Japanese Patent Laid-Open No. 2004-63688. When a lead frame having a structure that leads are arranged in an array on one side of a lead frame in its width direction is used, there is obtained a single-in-line semiconductor device Ms having a structure that lead terminals T are drawn out from one side of a resin-seal portion P in its width direction, as illustrated in FIGS. 18A and 18B. When a lead frame having a structure that the lead frame has leads on both sides thereof in its width direction is used, there is obtained a dual-in-line semiconductor device Md having a structure that lead terminals T and lead terminals T' are respectively drawn out from one and the other sides of a resin-seal portion P in its width direction, as illustrated in FIGS. 19A and 19B. Note that in FIGS. 18 and 19, CB denotes a circuit board whereon the semiconductor device is mounted.

The semiconductor devices illustrated in FIGS. 18 and 19 are mounted on the circuit board CB by, for example, inserting the respective lead terminals in through holes provided in the circuit board CB and soldering the lead terminals to a conductive pattern (not illustrated) provided in the circuit board CB. These types of semiconductor devices may in some cases be mounted on the circuit board by inserting the lead terminals in the female lead terminals of a socket mounted on the circuit board.

When a single-in-line semiconductor device is comprised using a lead frame where all leads are arranged on one side of the lead frame in its width direction, as illustrated in FIG. 18, the semiconductor device has had the problem of becoming ill-balanced if mounted on a circuit board CB smaller than the resin-seal portion P of the semiconductor device since the semiconductor device largely overhangs toward one side from the circuit board or the socket.

When a dual-in-line semiconductor device is comprised using a lead frame where leads are arranged on both sides of the lead frame in its width direction, as illustrated in FIGS. 19A and 19B, the width "W" of the resin-seal portion P increases to "W'" and therefore the distance "d" between the lead terminals T and T' also increases to "d'", as shown by one-dot chain lines in FIG. 19B, if a design change is made to enlarge the islands of the lead flame for reasons of, for example, enhancing the cooling effect of power elements, thus making it no longer possible to mount the semiconductor device on the same circuit board CB or the socket as was used before the design change even if the number of lead terminals remain the same, thereby resulting in the problem that costs involved in the design change increase.

Furthermore, the semiconductor device becomes hot whether it takes a single-in-line form or a dual-in-line form since all heat-evolving elements comprising the semiconductor device are buried in one resin-seal portion, thereby resulting in the problem that the cooling performance of the elements degrades.

Still furthermore, in a conventional semiconductor device, it has been unavoidable that the array patterns of islands and leads become complicated if there are an increased number of islands since leads to be provided for each island must be led to an end of a lead frame in its width direction. Accordingly, the structure of a punching die becomes complicated in a case where the lead frame is formed by punching, thereby resulting in the problem that the costs of the die increase.

Although a semiconductor device comprising a power circuit has been taken as an example above to explain problems with the semiconductor device, the same problems as described above arise also in a semiconductor device comprising an electronic circuit other than power circuits if the semiconductor device has a single-in-line construction or a dual-in-line construction.

SUMMARY OF THE INVENTION

It is an object of the present invention to provide a semiconductor device capable of being mounted on a circuit board in a well-balanced manner.

It is another object of the present invention to provide a semiconductor device in which it is possible to make a design change, such as a change in the dimensions of islands, without changing the array of leads and a distance therebetween.

It is yet another object of the present invention to provide a semiconductor device the cooling performance of which can be improved by reducing the number of semiconductor chips to be buried in one resin-seal portion to suppress a temperature rise.

It is still another object of the present invention to provide a semiconductor device the manufacturing costs of which can be reduced by simplifying the structure of a lead frame and thereby also simplifying the structure of a die for punching out the lead frame to reduce the costs of the die.

The present invention is applied to a semiconductor device that a plurality of semiconductor chips are mounted on a lead frame and seal portions are provided so as to cover the plurality of semiconductor chips and required portions of the lead frame to be covered.

In the present invention, a plurality of semiconductor chips are divided into a first group of semiconductor chips and a second group of semiconductor chips and both groups of semiconductor chips are mounted on one and the other sides of a lead frame in its width direction at a distance from one another. A seal portion is comprised of first and second resin-seal portions in which the first and second groups of semiconductor chips are respectively covered along with required portions of the lead frame to be covered, and the first and second resin-seal portions are mechanically coupled with each other using a coupling portion or portions. In addition, a gap is formed between the first and second resin-seal portions and the outer lead portions of a plurality of leads connected to circuits within the first resin-seal portion and the outer lead portions of a plurality of leads connected to circuits within the second resin-seal portion are drawn out through the gap between the first and second resin-seal portions as lead terminals.

As described above, if a semiconductor device is structured so that a plurality of semiconductor chips are divided into a first group of semiconductor chips and a second group of semiconductor chips, both groups of semiconductor chips being respectively mounted on one and the other sides of the lead frame in its width direction at a distance from one another, and the seal portion is divided into the first and second resin-seal portions in which the first and second groups of semiconductor chips are covered along with required portions of the lead frame to be covered respectively so that the lead terminals are drawn out from between both resin-seal portions, then the group of lead terminals are arranged in the center or in approximately the center of the semiconductor device in its width direction and the first and second resin-seal portions are arranged on both sides of the group of lead terminals, thus making it possible to mount the semiconductor device on the circuit board in a well-balanced manner by preventing the semiconductor device from largely overhanging toward one side of the circuit board when mounted on a circuit board smaller than the semiconductor device.

In addition, if the semiconductor device is comprised as described above, it is possible to increase or decrease the dimensions of each island along the width direction of the lead frame without changing the array of lead terminals and a distance therebetween, thereby making it possible to make a design change, such as a change in the dimensions of each island, without changing the array of the lead terminals and the distance therebetween. Consequently, if the number of lead terminals remains the same as a result of design change, the semiconductor device can be mounted on the same type of circuit board or socket as was used before design change even after the design change, thereby making it possible to reduce costs to be involved in the design change.

Furthermore, if semiconductor chips comprising the semiconductor device are divided into two groups and both groups of semiconductor chips are covered with separate resin-seal portions, as described above, it is possible to reduce the number of semiconductor chips to be buried in one resin-seal portion, thereby making it possible to suppress a temperature rise in the semiconductor device and improve the cooling performance thereof.

Still furthermore, if the semiconductor device is formed as described above, islands to mount the semiconductor chips on are arranged on one and other sides of the lead frame in its width direction and a group of leads are arranged in the center of the lead frame in its width direction, it is possible to simplify the array patterns of the islands and the group of leads in the lead frame. Consequently, it is possible to simplify the structure of a die for punching out the lead frame and prevent the costs of the die from increasing.

In a preferred aspect of the present invention, the above-described coupling portions are comprised of a plurality of leads which form part of the lead frame and both ends of each of the plurality of leads that form the coupling portions are respectively buried in the first resin-seal portion and in the second resin-seal portion.

If the leads that form part of the lead frame are used as the coupling portions as described above, it is preferable that there is formed a coupling resin-molded portions, in which the plurality of leads that form the coupling portions are covered respectively, so as to bridge the first resin-seal portion and the second resin-seal portion using the same resin as is used to form the first and second resin-seal portions so that the coupling resin-seal portions are also provided with the capability of mechanically coupling the first and second resin-seal portions.

As described above, if the coupling resin-molded portions are formed so as to bridge the first resin-seal portion and the second resin-seal portion, it is possible to connect between a cavity for molding the first resin-seal portion and a cavity for molding the second resin-seal portion through a cavity for molding the coupling resin-molded portions when forming the first and second resin-seal portions using a transfer molding mold, thereby making it possible to inject a resin into the cavities for molding both resin-seal portions either from the cavity for molding the first resin-seal portion or from the cavity for molding the second resin-seal portion. Consequently, the mold for molding the first and second resin-seal portions can be structured so as to have a resin injecting gate only in either the cavity for molding the first resin-seal portion or the cavity for molding the second resin-seal portion, thereby making it possible to simply the structure of the mold.

Furthermore, if the coupling resin-molded portions are formed so as to cover the leads that form the coupling portions for coupling between the first resin-seal portion and the second resin-seal portion to also provide this coupling resin-molded portions with the capability of coupling between both resin-seal portions, as described above, it is possible to increase the strength of the coupling portion for coupling between the first and the second resin-seal portions, thereby making it possible to increase the mechanical strength of the semiconductor device.

However, the present invention is not limited to a case where the coupling resin-molded portions are formed so as to cover the leads that form the coupling portions for coupling between the first resin-seal portion and the second resin-seal portion, as described above, but there may alternatively be formed coupling portions for coupling between the first resin-seal portion and the second resin-seal portion by resin-molding, without covering the leads, to couple between the first resin-seal portion and the second resin-seal portion using this coupling portion.

Even if the semiconductor device is formed as described above, it is possible to make the cavity for molding the first resin-seal portion and the cavity for molding the second resin-seal portion to communicate with each other through the cavity for molding the coupling portion, thereby making it possible to structure the mold so as to have a resin injecting gate only in either the cavity for molding the first resin-seal portion or the cavity for molding the second resin-seal portion, thus simplifying the structure of the mold for molding the resin-seal portions.

In another preferred aspect of the present invention, the above-described lead frame is provided with a first group of first to "n"th ("n" is an integer greater than or equal to 1) islands arranged on one end of the lead frame in its width direction in an array in the longitudinal direction of the lead frame and a second group of first to "m"th ("m" is an integer greater than or equal to 1) islands arranged on the other end of the lead frame in its width direction in an array in the longitudinal direction of the lead frame, and a group of leads including leads corresponding to each island are arranged in a space formed between the first group of islands and the second group of islands. The numerals "m" and "n" may or may not be equal to each other.

The above-described plurality of semiconductor chips are divided into a first group and a second group and the first group of semiconductor chips and the second group of semiconductor chips are respectively mounted on the lead frame islands belonging to the first group and the second group. A semiconductor chip mounted on each island is connected to predetermined leads corresponding to each island through wires.

In addition, the seal portion is comprised of a first resin-seal portion in which the first group of semiconductor chips, the lead frame islands belonging to the first group and the inner lead portions of leads corresponding to respective islands belonging to the first group are covered and a second resin-seal portion in which the second group of semiconductor chips, the lead frame islands belonging to the second group and the inner lead portions of leads corresponding to respective islands belonging to the second group are covered, where the first resin-seal portion and the second resin-seal portion are mechanically coupled with each other using the coupling portion.

A gap is formed between the above-described first and second resin-seal portions and the outer lead portions of leads to be connected to an external circuit, among the plurality of leads provided on the lead frame, are drawn out through the gap between the above-described first and second resin-seal portions as lead terminals.

In another preferred aspect of the present invention, a lead frame is provided with a first group of first to "n"th ("n" is an integer greater than or equal to 1) islands arranged on one end of the lead frame in its width direction in an array in the longitudinal direction of the lead frame and a second group of first to "n"th islands provided on the other end of the lead frame in its width direction so as to respectively pair with the first to "n"th islands of the first group, where the islands paired with each other in the first and second groups are arranged in the width direction of the lead frame at a distance from each other so as to face to each other and a plurality of leads corresponding to the respective paired islands are arranged in a space formed between the respective paired islands of the first and second groups.

Also in this case, the plurality of semiconductor chips are divided into a first group of semiconductor chips and a second group of semiconductor chips, where the first and second group of semiconductor chips are respectively mounted on the lead frame islands belonging to the first group and on the lead frame islands belonging to the second group, and the semiconductor chips mounted on the respective islands and the predetermined leads corresponding to the respective islands are connected to each other through wires.

The seal portion is comprised of a first resin-seal portion which covers the first group of semiconductor chips, the lead frame islands belonging to the first group and the inner lead portions of leads corresponding to the respective islands belonging to the first group, and a second resin-seal portion which covers the second group of semiconductor chips, the lead frame islands belonging to the second group and the inner lead portions of leads associated with the respective islands belonging to the second group, and the first resin-seal portion and the second resin-seal portion are mechanically coupled with each other using the coupling portion. In addition, a gap is formed between the first and second resin-seal portions and the outer lead portions of leads to be connected to an external circuit, among the plurality of leads, are drawn out through the gap between the above-described first and second resin-seal portions as lead terminals.

If the islands of the first and second groups are provided so as to pair with each other so that the leads corresponding to the paired islands are arranged between these paired islands, as described above, it is possible to arrange the leads to be provided for the respective islands in the immediate vicinity of the respective islands and, therefore, there is no need to route a specific lead all the way to a location distant from a corresponding island, thereby making it possible to simplify the pattern of the lead frame and make the manufacturing thereof easy.

In still another preferred aspect of the present invention, the above-described lead frame is provided with a first group of first to third islands arranged on one end of the lead frame in its width direction in an array in the longitudinal direction of the lead frame and a second group of first to third islands arranged on the other end of the lead frame in its width direction so as to respectively pair with the first to third islands of the first group. In this lead frame, the islands paired with each other in the first and second groups are arranged in the width direction of the lead frame at a distance from each other so as to face to each other and a plurality of leads corresponding to the respective paired islands are arranged in a space formed between the respective paired islands of the first and second groups.

In addition, the plurality of semiconductor chips include first to third diodes Du to Dw, fourth to sixth diodes Dx to Dz the anodes of which are connected in common and the cathodes of which are respectively connected to the anodes of the first to third diodes, thereby comprising a diode bridge three-phase full-wave rectifier circuit in conjunction with the first to third diodes, and first to third thyristors Thx to Thz respectively connected in reverse parallel to the fourth to sixth diodes and simultaneously triggered when the input terminals of the rectifier circuit are short-circuited in order to regulate the output voltage of the rectifier circuit, where the first to third diodes are mounted with the respective anodes thereof directly connected to the first to third lead frame islands of the second group and the fourth to sixth diodes are mounted with the respective anodes thereof directly connected to the first to third lead frame islands of the first group.

The first to third thyristors are mounted with the respective anodes thereof directly connected to the first to third islands of the second group and the semiconductor chips mounted on the respective islands respectively belonging to the first group and the second group and the predetermined leads corresponding to the respective islands are connected to each other through wires.

In this case, the seal portion is comprised of a first resin-seal portion in which the first to third islands of the first group, the semiconductor chips mounted on these islands, and the inner lead portions of leads corresponding to the respective islands belonging to the first group are covered and a second resin-seal portion in which the first to third islands of the second group, the semiconductor chips mounted on these islands, and the inner lead portions of leads corresponding to the respective islands belonging to the second group are covered, and the outer lead portions of leads to be connected to an external circuit, among the plurality of leads, are drawn out through the gap between the above-described first and second resin-seal portions as lead terminals.

The circuit comprised of the three-phase full-wave rectifier circuit comprised of the first to third diodes Du to Dw comprising the upper side of the bridge and the fourth to sixth diodes Dx to Dz comprising the lower side of the bridge and the first to third thyristors Thx to Thz connected in reverse parallel to the fourth to sixth diodes comprising the lower side of the bridge of this rectifier circuit is a circuit known as a short-circuit type voltage regulator circuit with a rectification function. In this voltage regulator circuit, since currents flow through the diodes comprising the lower side of the bridge whether the thyristors turn on (the outputs are short-circuited) or turn off, the amount of heat generated from the diodes comprising the lower side of the bridge becomes larger than that generated from the diodes comprising the upper side of the bridge. Hence, in the present invention, only the fourth to sixth diodes Dx to Dz which generate large amounts of heat are mounted on the lead frame islands of the first group and the first to third diodes Du to Dw and the first to third thyristors Thx to Thz which generate small amounts of heat are mounted on the islands of the second group, in order to deconcentrate heat sources and prevent a temperature rise in the semiconductor device.

In addition, if the semiconductor device is comprised as described above, it is only necessary that the anode of every diode be connected to each given island when mounting the diodes on the lead frame islands. Consequently, it is possible to mount all diodes on the lead frame using chips of the same type and using the same process, thereby making it possible to simplify the work of mounting the diodes.

As heretofore described, according to the present invention, since the semiconductor device is structured so that the plurality of semiconductor chips are divided into the first group of semiconductor chips and the second group of semiconductor chips, the semiconductor chips of both groups being respectively mounted on one and the other ends of the lead frame in its width direction at a distance from one another in the width direction of the lead frame, and the seal portion is divided into the first and second resin-seal portions in which the semiconductor chips of the first and second groups are respectively covered along with the required portions of the lead frame to be covered so that the lead terminals are drawn out from between both resin-seal portions, it is possible to arrange the group of lead terminals in the center or in approximately the center of the semiconductor device in its width direction and to arrange the first and second resin-seal portions on both sides of the group of lead terminals, thereby making it possible to mount the semiconductor device in a well-balanced manner without allowing the semiconductor device to be positioned toward one side of the circuit board.

Also according to the present invention, it is possible to increase or decrease the dimensions of each island along the width direction of the lead frame without changing the array of lead terminals and a distance therebetween, thereby making it possible to make a design change, such as a change in the dimensions of islands, without changing the array of lead terminals and a distance therebetween. Consequently, the semiconductor device can be mounted on the same type of circuit board or socket as was used before design change even after the design change if the number of lead terminals remains the same as a result of the design change, thereby making it possible to reduce costs to be involved in the design change.

Also in the present invention, since semiconductor chips are divided into two groups and the semiconductor chips of both groups are covered with separate resin-seal portions, it is possible to suppress a temperature rise in the semiconductor device and improve the cooling performance thereof by reducing the number of semiconductor chips to be buried in one resin-seal portion.

Also according to the present invention, since islands to mount semiconductor chips on are arranged on one and the other ends of a lead frame in its width direction and a group of leads are arranged in the center or in approximately the center of the lead frame in its width direction, it is possible to simplify the array patterns of islands and the group of leads in the lead frame. Consequently, it is possible to also simplify the die for punching out the lead frame, prevent the costs of the die from increasing and reduce the manufacturing costs thereof.

Furthermore, in the present invention, if the islands of the first and second groups are provided so as to pair with each other and the leads corresponding to the paired islands are arranged between these paired islands, it is possible to arrange the leads to be provided for the respective islands in the immediate vicinity of the respective islands and, therefore, there is no need to route a specific lead all the way to a location distant from a corresponding island, thereby making it possible to simplify the pattern of the lead frame and make the manufacturing thereof easy.

BRIEF DESCRIPTION OF THE DRAWINGS

FIG. 5A is a front view illustrating a half-processed product obtained by separating the two half portions of the lead frame of the half-processed product illustrated in FIG. 4 and FIG. 5B is a cross-sectional view provided by cutting the half-processed product illustrated in FIG. 5A along the "VB-VB" line;

FIG. 10 is a waveform chart illustrating the input current and output current of the short-circuit type voltage regulator circuit shown in FIG. 1;

DETAILED DESCRIPTION OF THE PREFERRED EMBODIMENTS

Preferred embodiments of the present invention will hereinafter be described in detail with reference to the accompanying drawing.

In the present embodiment, there is taken as an example a semiconductor device comprising a power circuit used for a short-circuit type voltage regulator circuit for controlling a voltage supplied from a three-phase magnetic AC generator driven by a motor, such as an engine, to a DC load so that the voltage is kept to within a preset range.

Figure 1:
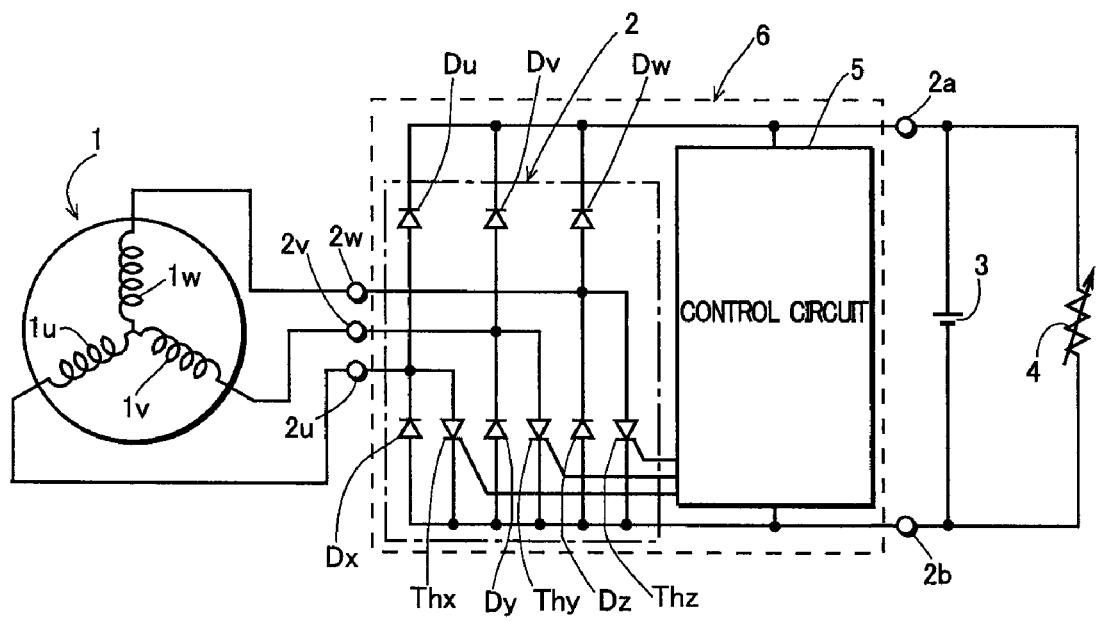
FIG. 1 is a circuit diagram illustrating the circuit construction of a semiconductor device which is comprised using a lead frame in accordance with one embodiment of the present invention.

In FIG. 1, 1 denotes a three-phase magnetic AC generator driven by a motor, where the generator is comprised of a magnetic rotator (not illustrated) mounted on the rotating shaft of the motor and a stator having three-phase armature coils 1*u* to 1*w*. 2 denotes a semiconductor device whereto the present invention is applied, where the semiconductor device comprises a short-circuit type voltage regulator circuit (a part in which a large current flows) having a rectification function.

The illustrated short-circuit type voltage regulator circuit is comprised of first to third diodes Du, Dv and Dw, a diode bridge three-phase full-wave rectifier circuit comprised of fourth to sixth diodes Dx to Dz the anodes of which are connected in common and the cathodes of which are connected to the anodes of the diodes Du to Dw, and first to third thyristors Thx to Thz for short-circuiting a generator output respectively connected in reverse parallel to both ends of the fourth to sixth diodes Dx to Dz comprising the lower side of the bridge of the rectifier circuit. The positive output terminal 2*a* and the negative output terminal 2*b* of the semiconductor device are respectively drawn out from the common connection point of the cathodes of the first to third diodes Du to Dw and from the common connection point of the anodes of the fourth to sixth diodes Dx to Dz. A battery 3 and a load 4 are connected between these output terminals. The connection points of the anodes of the first to third diodes Du to Dw and the cathodes of the fourth to sixth diodes Dx to Dz respectively serve as three-phase AC input terminals 2*u*, 2*v* and 2*w* and the three-phase output terminals of the generator are connected to these input terminals 2*u*, 2*v* and 2*w*.

A reference numeral 5 denotes a control circuit comprised of a hybrid IC, where the control circuit detects a voltage between the output terminals 2*a* and 2*b*, simultaneously provides trigger signals to the first to third thyristors Thx to Thz if the detected voltage exceeds a setpoint, and stops supplying the trigger signals to the thyristors Thx to Thz if the voltage between the output terminals 2*a* and 2*b* falls below the setpoint. A short-circuit type voltage regulator 6 having a rectification function is comprised of the semiconductor device 2 and the control circuit 5.

In the voltage regulator shown in FIG. 1, the thyristors Thx to Thz are in an off state if a voltage between the output terminals 2*a* and 2*b* is lower than a setpoint and the rectified output of the generator 1 is applied to the battery 3 and the load 4. Since the control circuit 5 provides trigger signals to the thyristors Thx to Thz if the voltage between the output terminals 2*a* and 2*b* exceeds the setpoint, a thyristor, among these thyristors, between the anode and cathode of which a forward voltage is applied goes to an on state, thereby short-circuiting the output of the generator 1 through a short circuit comprised of the turned-on thyristor and one of the diodes Dx to Dz comprising the lower side of the bridge of the rectifier circuit. Consequently, the output voltage of the generator is decreased below the setpoint. If the voltage between the output terminals 2a and 2b decreases below the setpoint due to a drop in the output voltage of the generator, each thyristor turns off the moment the anode current thereof decreases below a holding current since no trigger signals are provided to the thyristors Thx to Thz. Consequently, the output voltage of the generator rises. As a result of these actions being repeated, the voltage between the output terminals 2a and 2b is kept near the setpoint.

The waveforms of three-phase currents flowing from the generator into the voltage regulator circuit and the output current waveforms thereof in the example shown in FIG. 1 are illustrated in FIG. 10. A, B and C in FIG. 10 respectively denote phase currents Iu, Iv and Iw flowing from the armature coils 1u, 1v and 1w of three phases U, V and W into the voltage regulator circuit and D and E in the figure respectively denote the waveforms of currents output from the voltage regulator circuit when the thyristors Thx to Thz turn off and turn on. In this example, a current flowing from the neutral point of the armature coils 1u to 1w toward the nonneutral point side terminal of the coil of each phase is defined as the positive half cycle of the current of each phase. In the circuit illustrated in FIG. 1, when attention is paid to the phase-U arm comprised of a series circuit formed of a parallel circuit comprising the diode Dx and the thyristor Thx and of the diode Du, it is understood that a current flows through the diode Du in the positive half cycle of a phase-U current Iu and a current flows through the diode Dx in the negative half cycle of the phase-U current Iu when the output is not short-circuited (the thyristors Thx to Thz are in an off state). In addition, a current flows through the thyristor Thx in the positive half cycle of the phase-U current Iu and a current flows through the diode Dx in the negative half cycle of the phase-U current Iu when the output is short-circuited (the thyristors Thx to Thz are triggered).

Likewise, when attention is paid to the phase-V arm comprised of a series circuit formed of the parallel circuit comprising the diode Dy and the thyristor Thy and of the diode Dv, it is understood that a current flows through the diode Dv in the positive half cycle of a phase-V current Iv and a current flows through the diode Dy in the negative half cycle of the phase-V current Iv when the output is not short-circuited. In addition, a current flows through the thyristor Thy in the positive half cycle of the phase-V current Iv and a current flows through the diode Dy in the negative half cycle of the phase-V current Iv when the output is short-circuited.

When attention is paid to the phase-W arm comprised of a series circuit formed of a parallel circuit comprising the diode Dz and the thyristor Thz and of the diode Dw, it is understood that a current flows through the diode Dw in the positive half cycle of a phase-W current Iw and a current flows through the diode Dz in the negative half cycle of the phase-W current Iw when the output is not short-circuited. In addition, a current flows through the thyristor Thz in the positive half cycle of the phase-W current Iw and a current flows through the diode Dz in the negative half cycle of the phase-W current Iw when the output is short-circuited.

As described above, in the voltage regulator circuit shown in FIG. 1, since currents only flow through the diodes Du to Dw comprising the upper side of the bridge in the positive half cycle of each phase current when the output is not short-circuited, whereas currents flow through the diodes Dx to Dz comprising the lower side of the bridge in the negative half cycle of each phase current irrespective of whether the output is short-circuited or not short-circuited, the amount of heat generated at the diodes Dx, Dy and Dz comprising the lower side of the bridge becomes larger than the amount of heat generated at the diodes Du, Dv and Dw comprising the upper side of the bridge.

Figure 2:
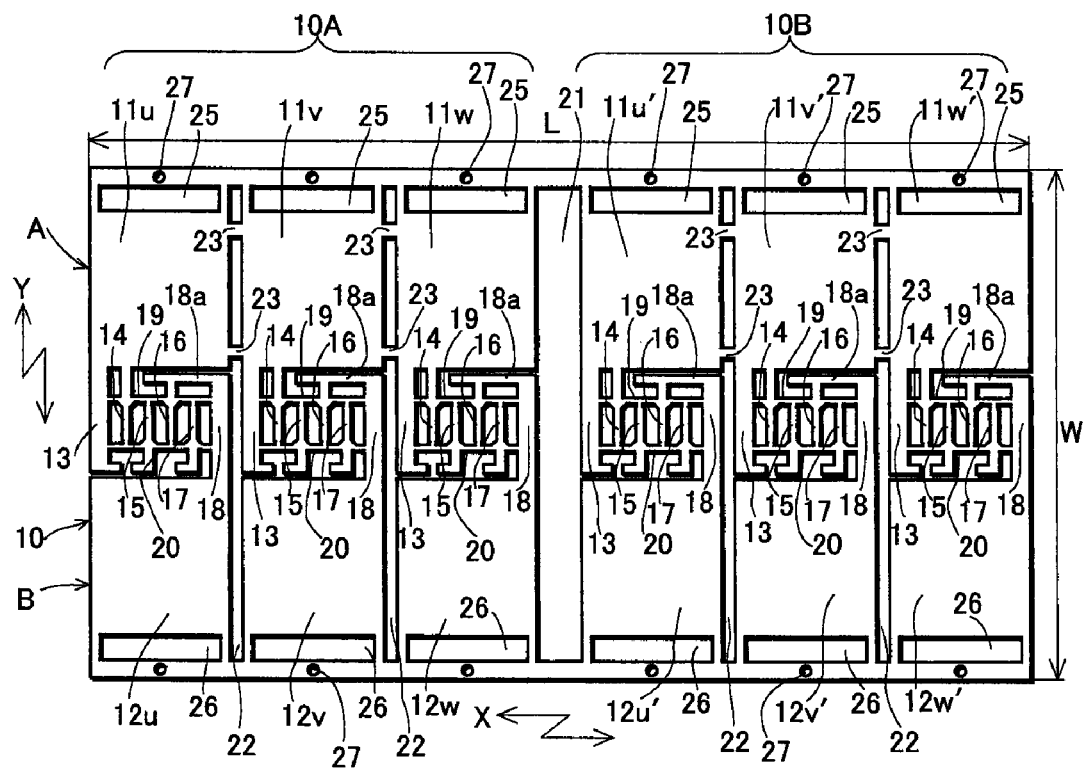
FIG. 2 is a front view illustrating the construction of a lead frame in accordance with an embodiment of the present invention.

FIG. 2 illustrates a preferred example of construction of a lead frame 10 used to comprise the semiconductor device 2 illustrated in FIG. 1. This lead frame is comprised so as to be rectangular in its entirety, by punching out a relatively thick plate made of a conductive material, such as copper, having excellent conductivity, and has predetermined dimensions W and L in its width direction (Y direction) and longitudinal direction (X direction), respectively.

The illustrated lead frame 10 has islands and leads worth two semiconductor devices. In first half portion 10A occupying the left-side half portion of the illustrated lead frame, there are provided first to third islands 11u to 11w of first group A, first to third islands 12u to 12w of a second group B, and a group of leads including leads 13 to 18 provided for these islands, and these components are used to comprise one semiconductor device. In addition, in second half portion 10B occupying the right-side half portion of the illustrated lead frame, there are provided first to third islands 11u' to 11w' of first group A, first to third islands 12u' to 12w' of a second group B, and a group of leads including leads 13 to 18 provided for these islands, and these components are used to form the other semiconductor device.

In the illustrated example, each island is formed in a rectangular shape and the islands 11u to 11w and the islands 11u' to 11w' belonging to the first group A are provided so as to respectively pair with the islands 12u to 12w and the islands 12u' to 12w' belonging to the second group B. In this example, since a heat-generating power semiconductor chip is mounted on each island, each island is formed so as to have a relatively large thickness in order to provide the island with a heat-sinking function.

The first to third islands 11u to 11w belonging to the first group A provided in the first half portion 10A of the lead frame and the first to third islands 11u' to 11w' belonging to the second half portion 10B are provided on one end of the lead frame 10 in its width direction in an array in the longitudinal direction of the lead frame.

In addition, the first to third islands 12u to 12w belonging to the second group B provided in the first half portion 10A of the lead frame 10 and the first to third islands 12u' to 12w' belonging to the second half portion 10B are provided on the other end of the lead frame in its width direction and are arranged in an array in the longitudinal direction of the lead frame as with the islands of the first group.

The paired islands 11u and 12u, 11v and 12v, and 11w and 12w are arranged in the width direction of the lead frame at a distance from each other so as to face to each other, and a plurality of leads 13 to 18 respectively provided in association with each paired islands are arranged in a space between each paired islands formed in the center of the lead frame in its width direction. Each lead is formed so as to have a thickness smaller than that of the islands.

The leads 13 and 14, among the leads 13 to 18 disposed between each paired islands (for example, 11u and 12u), are provided with the rear ends thereof connected to the island 11u belonging to the first group A and the lead 18 is provided with the rear end thereof connected to the island 12u belonging to the second group B.

The leads 13, 14 and 18 extend along the width direction of the lead frame 10, where the front end of the lead 13 is terminated at a position proximate to the island 12u belonging to the second group B and the front end of the lead 14 is terminated at a position short of the front end of the lead 13.

In addition, the front end of the lead 18 extends to a position proximate to the island 11*u* belonging to the first group A and the rear end of the lead 16 extending along the width direction of the lead frame toward the second group of islands is connected to a cross lead 18*a* turning at the front end of the lead 18 toward the lead 14 side and extending in the direction across the direction in which the paired islands face to each other.

The lead 16 is arranged at an approximately midpoint between the lead 14 and the lead 18, where the front end of the lead 16 is terminated at a position distant from the island 12*u* belonging to the second group B. Between the lead 14 and the lead 16 and between the lead 16 and the lead 18, there are respectively arranged the lead 15 and the lead 17 extending along the width direction of the lead frame.

The leads 15 and 17 are provided with the rear ends thereof located at positions proximate to the island 12*u*, among the paired islands, belonging to the second group B and the front ends thereof terminated at positions distant from the island 11*u* belonging to the first group A. A series of the leads 13 to 18 arranged between each paired islands are coupled with one another through separable connecting leads 19 and 20 extending along the longitudinal direction of the lead frame.

In addition, a relatively wide slit 21 extending in the width direction of the lead frame is formed between the first half portion 10A and the second half portion 10B, in order to partition the first half portion 10A and the second half portion 10B of the lead frame 10 from each other. In this example, one unitary lead frame is comprised of each paired islands and the leads 13 to 18 arranged therebetween and a total of three unitary lead frames are respectively comprised in the first and second half portions 10A and 10B of the lead frame.

Furthermore, narrow slits 22 extending in the width direction of the lead frame are formed so as to partition, from one another, the three unitary lead frames comprised in each of the half portions 10A and 10B of the lead frame 10 and there coupling portions 23 for electrically connecting the islands 11*u* to 11*w* belonging to the first group are provided so as to decouple the slits 22 from one another.

Rectangular slits 25 and 26 extending in the longitudinal direction of the lead frame are respectively formed between each island belonging to the first group A and one end of the lead frame in its width direction and between each island belonging to the second group B and the other end of the lead frame in its width direction, and positioning holes 27 used to engage positioning pins when positioning the lead frame in a jig are formed in strip-shaped portions remaining at one and the other ends of the lead frame in its width direction.

As described above, in the present embodiment, the lead frame 10 is provided with the first to third islands 11*u* to 11*w* of the first group arranged on one end of the lead frame in its width direction in an array in the longitudinal direction of the lead frame and the first to third islands 12*u* to 12*w* of the second group provided on the other end of the lead frame in its width direction so as to respectively pair with the first to third islands 11*u* to 11*w* of the first group, where each paired islands of the first and second groups are arranged face to face at a distance from each other in the width direction of the lead frame and a plurality of leads 13 to 18 corresponding to each paired islands are arranged in a space formed between each paired islands of the first and second groups.

Figure 3:
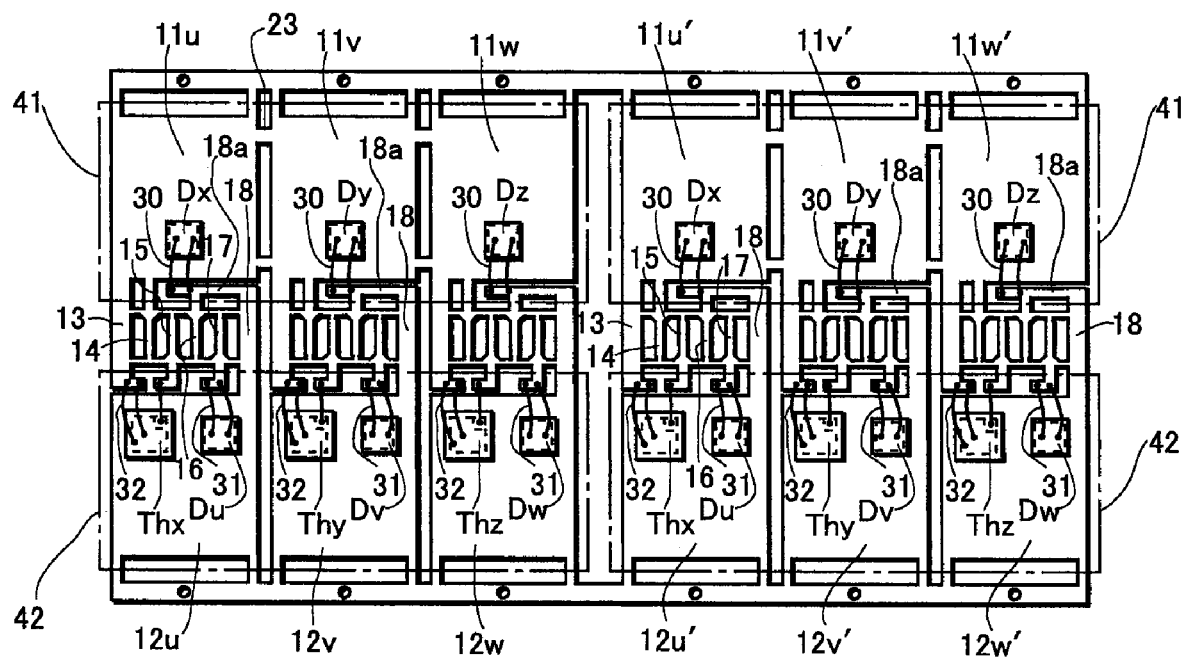
FIG. 3 is a front view illustrating a condition where semiconductor chips are mounted on the lead frame shown in FIG. 2 and the semiconductor chips and leads are connected to each other using wires.

FIG. 3 illustrates a condition where semiconductor chips comprising the semiconductor device 2 illustrated in FIG. 1 are mounted on the above-described lead frame 10 and wired. In the semiconductor device in accordance with the present invention, a plurality of semiconductor chips are divided into first group of semiconductor chips and a second group of semiconductor chips and the semiconductor chips of both groups are mounted at a distance from each other on one and the other ends of the lead frame in its width direction, respectively.

As seal portions, there are provided a first resin-seal portion 41 and a second resin-seal portion 42 in which the first and second groups of semiconductor chips are covered along with required portions of the lead frame to be covered, and the first resin-seal portion 41 and the second resin-seal portion 42 are mechanically coupled with each other using coupling portions. A gap is formed between the first resin-seal portion 41 and the second resin-seal portion 42 and the outer lead portions of a plurality of leads connected to circuits within the first resin-seal portion 41 and the outer lead portions of a plurality of leads connected to circuits within the second resin-seal portion 42 are drawn out through the gap between the first resin-seal portion 41 and the second resin-seal portion 42 as lead terminals.

To explain it in more detail, in the present embodiment there are provided the first to third diodes Du to Dw, the fourth to sixth diodes Dx to Dz the anodes of which are connected in common and the cathodes of which are respectively connected to the anodes of the first to third diodes Du to Dw to form the diode bridge three-phase full-wave rectifier circuit in conjunction with the first to third diodes Du to Dw, and the first to third thyristors Thx to Thz respectively connected in reverse parallel to the fourth to sixth diodes Dx to Dz and simultaneously triggered when the input terminals (output terminals of the generator 1) of the rectifier circuit are short-circuited to regulate the output voltage of the rectifier circuit, for comprising the short-circuit type voltage regulator circuit shown in FIG. 1, and chips comprising these semiconductor elements are mounted on the lead frame 10. In the present embodiment, the chips of the fourth to sixth diodes Dx to Dz are the semiconductor chips of the first group and the chips of the first to third diodes Du to Dw and the chips of the thyristors Thx to Thz are the semiconductor chips of the second group. The cathodes of the first to third diodes Du to Dw are connected in common to the positive output terminal when the semiconductor device of the present embodiment is mounted on a circuit board through a wiring pattern provided on the circuit board.

In the example illustrated in FIG. 3, the chips of the diodes Dx to Dz comprising the lower side of the bridge are respectively mounted on the first group islands 11*u* to 11*w* of the lead frame 10. As these diodes, chips each having an anode on one side and a cathode on the other side are used and the anodes of the respective diodes are directly soldered to the islands 11*u* to 11*w*. Likewise, the diodes Dx to Dz are mounted on the islands 11*u*' to 11W'.

In addition, the chips of the thyristors Thx to Thz and the chips of the diodes Du to Dw are respectively mounted on the second group islands 12*u* to 12*w*. As the chips of the thyristors Thx to Thz, chips each having an anode on one side and a cathode and a gate on the other side are used and the anodes of the respective thyristors are soldered to the islands 12*u* to 12*w*. In addition, the anodes of the diodes Du to Dw are directly soldered to the islands 12*u* to 12*w*. Likewise, the chips of the diodes Du to Dw and the chips of the thyristors Thx to Thz are respectively mounted on the second group islands 12*u*' to 12W'.

Then, the cathodes of the diodes Dx to Dz mounted on the first group islands are connected to corresponding cross leads 18*a* through a plurality of wires 30 (two wires in the illustrated example) and the cathodes of the diodes Du to Dw are connected to the rear ends of corresponding leads 17 through a plurality of wires 31. In addition, the cathodes of the thyristors Thx to Thz are connected to the frond ends of corresponding leads 13 through a plurality of wires 32 and the gates of the thyristors Thx to Thz are connected to the rear ends of corresponding leads 15 through wires. In order to be able to shorten the length of wires when connecting between the terminals of each semiconductor chip and predetermined leads through wires, each semiconductor chip is arranged at a position close to leads. By shortening wires for connecting between each semiconductor chip and leads, it is possible to not only reduce the amount of heat generated at wires but also prevent such problems as that a wire breakage occurs as a result of a wire being moved when the resin-seal portions are formed.

After wiring between the semiconductor chips mounted on all islands and the predetermined leads, the inner lead portions of leads 13, 16 and 18 electrically connected to the first to third islands 11u to 11w belonging to the first group A and to the semiconductor chips respectively mounted on the first to third islands 11u to 11w, the semiconductor chips mounted on the first to third islands 11u to 11w belonging to the first group A, and the wires 30 connecting the semiconductor chips to the leads 18 are covered with a resin, thereby comprising a flat plate-like first resin-seal portion 41.

In addition, the inner lead portions of leads 13, 15, 17 and 18 electrically connected to the first to third islands 12u to 12w belonging to the second group B and to the semiconductor chips respectively mounted on the first to third islands 12u to 12w, the semiconductor chips mounted on the first to third islands 12u to 12w belonging to the second group B, and wires connecting the semiconductor chips to the respective leads are covered with a resin, thereby comprising a flat plate-like second resin-seal portion 42. The first and second resin-seal portions 41 and 42 are formed by transfer molding.

Figure 4:
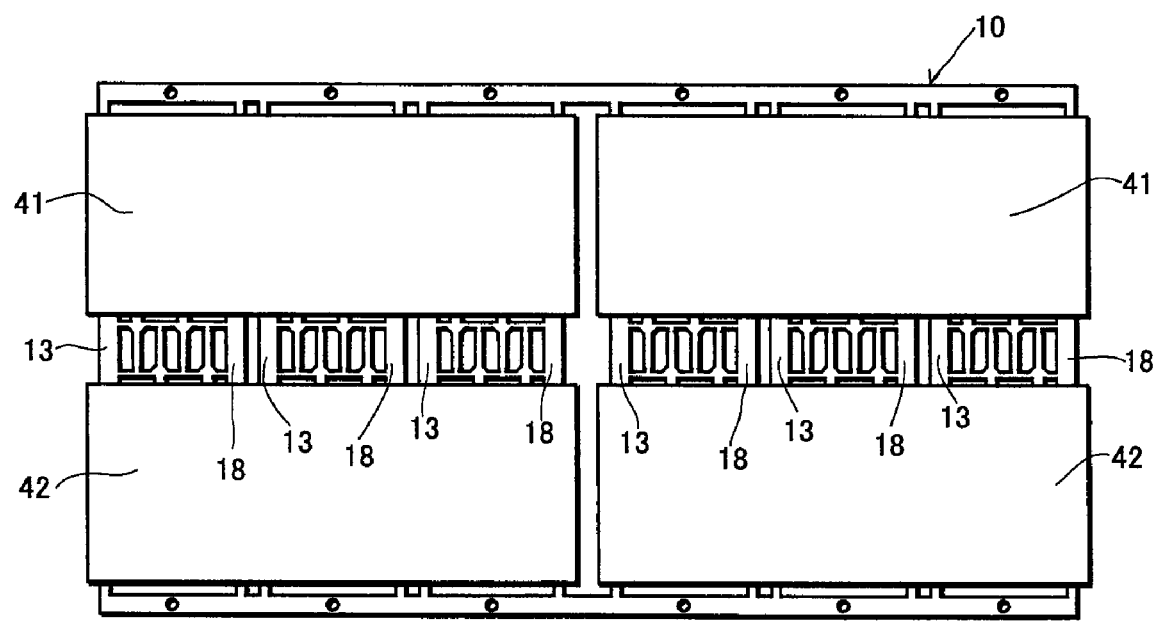
FIG. 4 is a front view illustrating a half-processed product obtained by forming resin-seal portions on the lead frame whereon semiconductor chips are mounted as shown in FIG. 3.

FIG. 4 illustrates a condition where the first resin-seal portion 41 and the second resin-seal portion 42 are formed as described above. A gap is formed between the first and second resin-seal portions 41 and 42. In this example, a plurality of leads 13 and 18 forming part of the lead frame serve as coupling portions for mechanically coupling between the first and second resin-seal portions 41 and 42, where both ends of each of leads comprising these coupling portions are buried within the first and second resin-seal portions 41 and 42.

Figure 6:
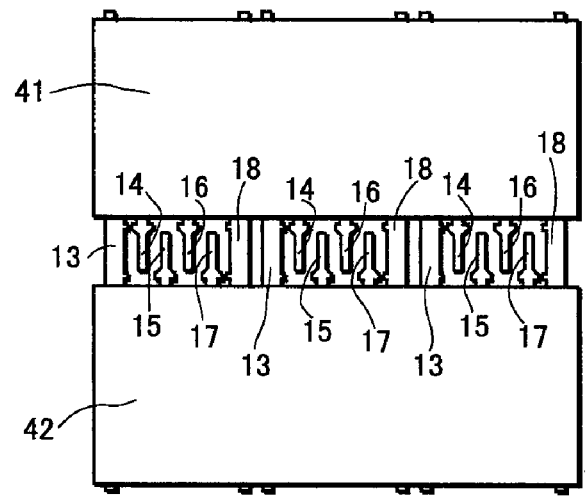
FIG. 6 is a front view illustrating a half-processed product obtained by cutting off the outer frame of the lead frame from the half-processed product illustrated in FIG. 5.
Figures 7A, 7B, 7C:
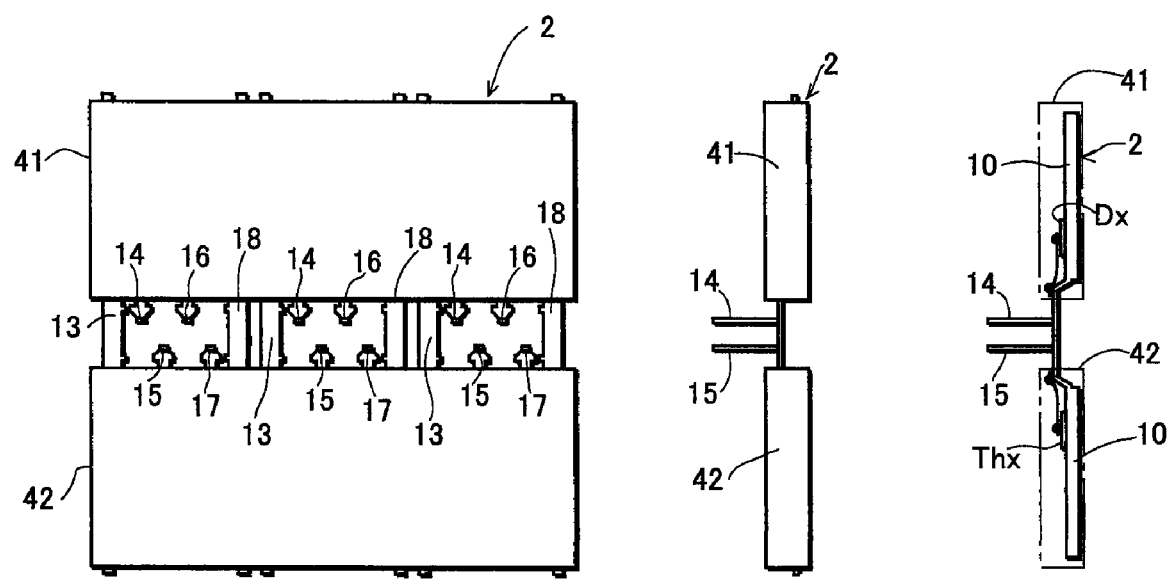
FIGS. 7A and 7B are a front view and a right side view, respectively, illustrating a finished semiconductor device obtained by shaping the lead frame of the half-processed product illustrated in FIG. 6
FIG. 7C is a right side view schematically showing the inside of the resin-seal portions.

After forming the resin-seal portions 41 and 42 as described above, the two half portions 10A and 10B of the lead frame are separated from each other, as illustrated in FIG. 5, and then unnecessary portions of the lead frame, such as the connecting leads, are cut off, as illustrated in FIG. 6. Then, as illustrated in FIGS. 7A to 7C, the outer lead portions of the leads 14 to 17 are drawn out from the gap between the resin-seal portions 41 and 42 as lead terminals by performing shaping in order to bend the outer lead portions of the leads 14 to 17 (portions exposed from the resin-seal portions) toward one side, thereby completing the semiconductor device 2.

In this semiconductor device, both ends of the leads 13 and 18, among the plurality of leads 13 to 18, arranged on both sides of each island are buried within the first resin-seal portion 41 and the second resin-seal portion 42 and the first and second resin-seal portions 41 and 42 are mechanically coupled with each other through the leads 13 and 18 both ends of which are buried within the first and second resin-seal portions.

Figure 8A:
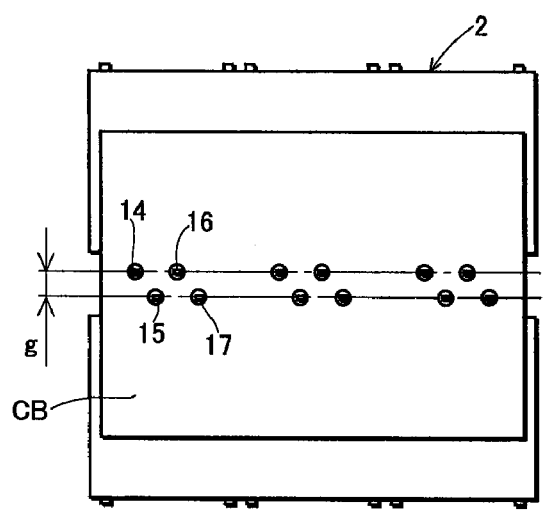
FIGS. 8A and 8B are a front view and a right side view, respectively, illustrating a condition where a semiconductor device in accordance with the present invention is mounted on a circuit board.
Figure 8B:
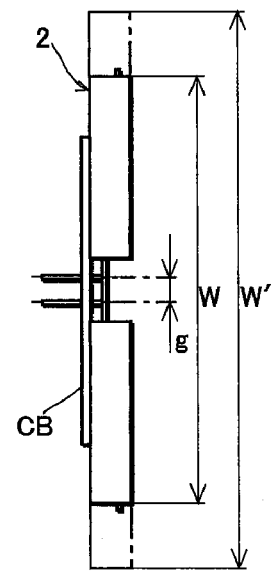

FIGS. 8A and 8B illustrate a condition where the semiconductor device 2 obtained as described above is mounted on a circuit board CB. In this example, the semiconductor device 2 is mounted on the circuit board CB by inserting the leads 14 to 17 of the semiconductor device 2 in through holes provided in the center of the circuit board CB in its width direction and soldering the leads to a conductive pattern provided in the circuit board.

If the leads 13 to 18 are arranged in the center of the lead frame 10 in its width direction and the islands of the first group A and second group B are arranged on both sides of the leads, as described above, a distance "g" between lead terminals remains the same even if the dimensions of the islands belonging to the first and second groups are increased in the width direction of the lead frame to make a design change so as to increase the width "W" of the semiconductor device to "W'" as illustrated in FIG. 8. Consequently, if the number of lead terminals remains the same as a result of design change, it is possible to mount the semiconductor device on the same type of circuit board or socket as was used before the design change even after the design change, thereby making it possible to reduce costs involved in the design change.

In addition, as described in the above-cited embodiment, if the leads 13 to 18 are arranged in the center of the lead frame 10 in its width direction and the islands are arranged on both sides of the leads so that when the semiconductor device 2 is comprised, the first resin-seal portion 41 and the second resin-seal portion 42 are arranged on both sides of the lead terminals, as illustrated in FIG. 8, it is possible to mount the semiconductor device 2 in a well-balanced manner without allowing the semiconductor device 2 to be positioned toward one side of the circuit board CB.

Figure 18A:
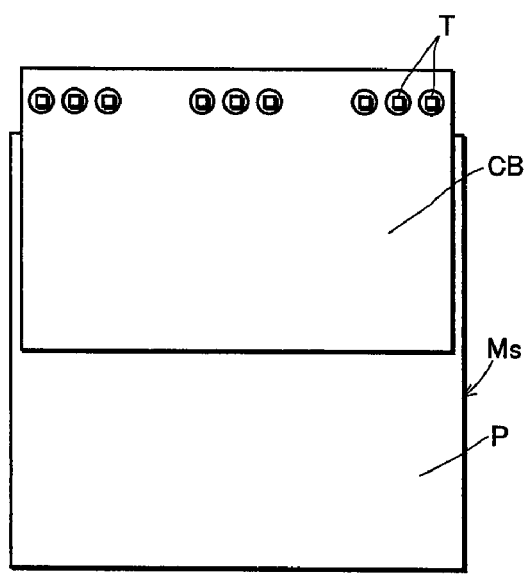
FIGS. 18A and 18B are a front view and a right side view, respectively, illustrating a condition where a conventional single-in-line semiconductor device is mounted on a circuit board.
Figure 18B:
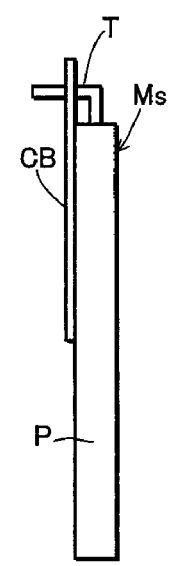
Figure 19A:
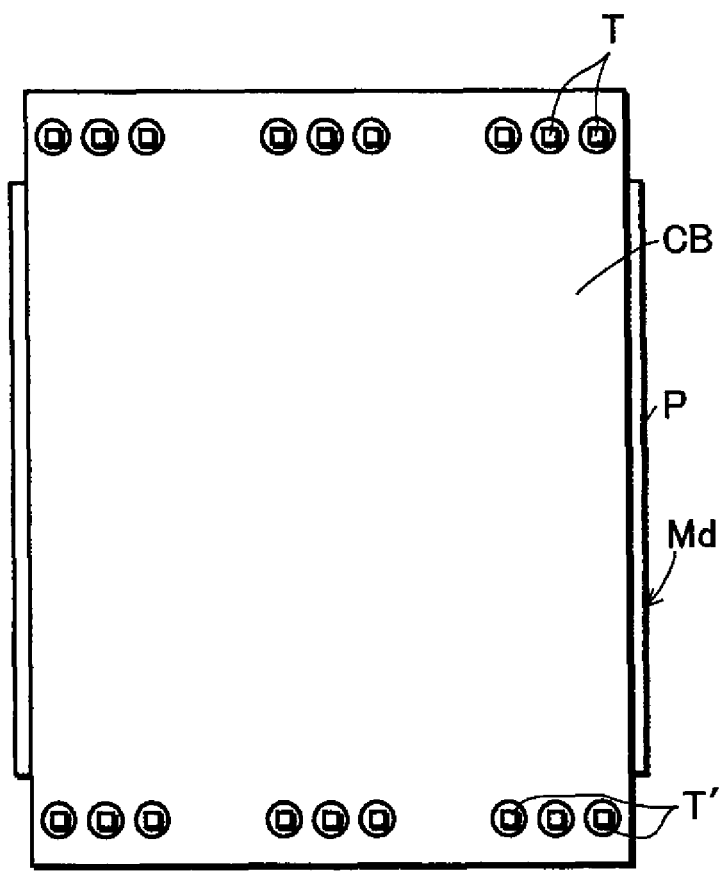
FIGS. 19A and 19B are a front view and a right side view, respectively, illustrating a condition where a conventional dual-in-line semiconductor device is mounted on a circuit board.
Figure 19B:
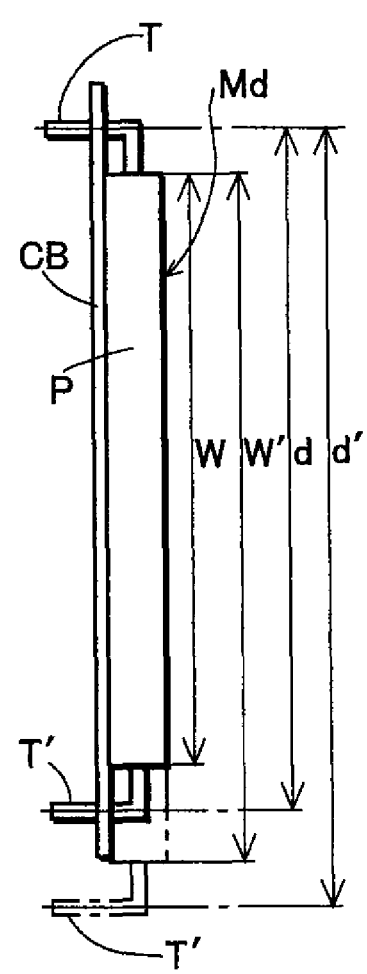

Furthermore, if islands are divided into a first group A and a second group B and semiconductor chips mounted on the first group islands and semiconductor chips mounted on the second group islands are separately sealed with the first resin-seal portion 41 and the second resin-seal portion 42 as with the above-cited embodiment, it is possible to reduce the number of heat-generating elements arranged within one resin-seal portion, compared with the semiconductor device illustrated in FIG. 18 or 19 where semiconductor chips as a whole are sealed with one resin-seal portion, thereby making it possible to enhance the performance of heat radiation from islands and suppress a temperature rise in the semiconductor device.

Still furthermore, if each island belonging to the first group is combined with any one of the islands belonging to the second group to make a pair and corresponding leads are arranged between each paired islands as with the above-described embodiment, the leads to be provided for each island can be arranged in the immediate vicinity of each island. As a result, there is no need to route the leads all the way to locations distant from a corresponding island, thereby making it possible to simplify the pattern of the lead frame and make the manufacturing thereof easy.

Still furthermore, if semiconductor chips comprising one semiconductor device are divided into two groups and both groups of semiconductor chips are covered with separate resin-seal portions, as described above, it is possible to reduce the number of semiconductor chips to be buried within one resin-seal portion, thereby making it possible to suppress a temperature rise in the semiconductor device and improve the cooling performance thereof.

In the above-cited embodiment, in particular, it is possible to prevent a temperature rise in the semiconductor device since heat sources are deconcentrated by mounting only the fourth to sixth diodes Dx to Dz which generate large amounts of heat on the first group islands 11u to 11w of the lead frame 10 and mounting the first to third diodes Du to Dw and the first to third thyristors Thx to Thz which generate small amounts of heat on the second group islands 12u to 12w.

In addition, if the semiconductor device is comprised as with the above-cited embodiment, it is only necessary that the anode of every diode be connected to each given island when mounting the diodes comprising the short-circuit type voltage regulator circuit on the lead frame islands and, therefore, it is possible to mount all diodes on the lead frame using chips of the same type and using the same process, thereby making it possible to perform the work of mounting the diodes in an efficient manner.

In addition, if islands to mount semiconductor chips on are arranged on one and the other ends of the lead frame 10 in its width direction and a group of leads are arranged in the center of the lead frame in its width direction, as described above, there is no need to route the leads in an complicated manner and it is possible to simplify the array patterns of the islands and the group of leads in the lead frame, thereby making it possible to simplify the structure of a die for punching out the lead frame and reduce the costs of the die.

Figure 9A:
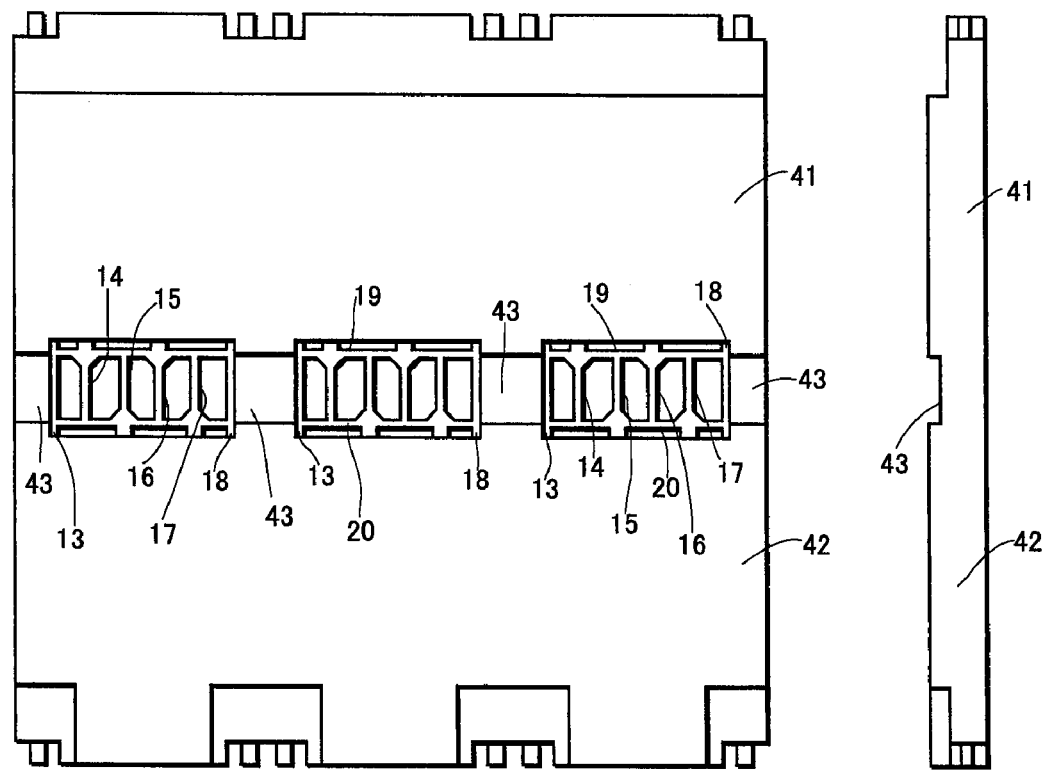
FIGS. 9A and 9B are a front view and a right side view, respectively, illustrating an external view of a semiconductor device in accordance with another embodiment of the present invention prior to cutting off unnecessary portions of the leads of the semiconductor device.
Figure 9B:
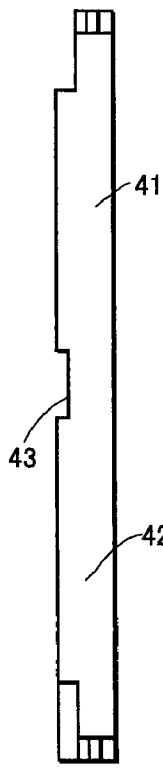

In the above-described embodiment, the first resin-seal portion 41 and the second resin-seal portion 42 are only coupled with each other through the leads 13 and 18 and are not coupled with each other through a resin and, hence, it is preferable that coupling resin-molded portions 43 in which a plurality of leads 13 and 18 comprising coupling portions are covered be formed using the same material as that comprising the first resin-seal portion 41 and the second resin-seal portion 42 so as to bridge both resin-seal portions, so that the first and second resin-seal portions 41 and 42 are also mechanically coupled with each other using the coupling resin-molded portions 43, as illustrated in FIGS. 9A and 9B. Note that FIG. 9 illustrates a condition before connecting leads 19 and 20 are separated.

If the coupling portions for coupling between the first resin-seal portion 41 and the second resin-seal portion 42 are comprised of leads only, the leads that form the coupling portions may become bent when an external force is applied to each resin-seal portion from a direction perpendicular to the surface of the lead frame. In contrast, if the coupling resin-molded portions are provided so as to cover the leads that form the coupling portions, as described above, it is possible to increase the mechanical strength of the coupling portions for coupling between both resin-seal portions.

As illustrated in FIG. 5, if the first resin-seal portion 41 and the second resin-seal portion 42 are coupled with each other using leads only, resin injection gates must be provided in both a cavity provided in a transfer molding die to mold the first resin-seal portion 41 and a cavity provided in the transfer molding die to mold the second resin-seal portion 42 when forming the first and second resin-seal portions 41 and 42. If resin injection gates are respectively provided in the two cavities as described above, the die becomes complicated in terms of the structure and therefore will become unavoidably expensive.

In contrast, if the coupling resin-molded portion 43 is provided as illustrated in FIG. 9, it is possible to make the cavities for molding the first and second resin-seal portions communicate with each other through a cavity for molding a coupling resin-molded portion when molding the first resin-seal portion 41 and the second resin-seal portion 42 using a transfer-molding die, thereby making it possible to inject a resin from either one of the cavity for molding the first resin-seal portion and the cavity for molding the second resin-seal portion into the cavities for molding both resin-seal portions. Consequently, it is possible to simplify the structure of the die for molding the first and second resin-seal portions 41 and 42 so that the die has a resin injecting gate only in either one of the cavity for molding the first resin-seal portion and the cavity for molding the second resin-seal portion, thereby making it possible to reduce the costs of the die.

Alternatively, there may be provided a resin coupling portion one end of which is integrated with the first resin-seal portion 41 and the other end of which is integrated with the second resin-seal portion 42 so as to bridge the first and second resin-seal portions 41 and 42 to couple between the first and second resin-seal portions, instead of providing the coupling resin-molded portion 43 with the leads therein covered, as described above, if it is not possible to provide leads for coupling between the first and second resin-seal portions.

Even if the semiconductor device is comprised as described above, it is possible to make the cavity for molding the first resin-seal portion and the cavity for molding the second resin-seal portion communicate with each other through the cavity for molding the resin coupling portion, thereby making it possible to simplify the structure of the die for molding the first and second resin-seal portions 41 and 42 so that the die has a resin injecting gate only in either one of the cavity for molding the first resin-seal portion and the cavity for molding the second resin-seal portion.

In the description made above, although there has been taken as an example the semiconductor device used for the three-phase short-circuit type voltage regulator circuit shown in FIG. 1, the present invention is applicable to a semiconductor device comprising another power circuit or the like.

Figure 11:
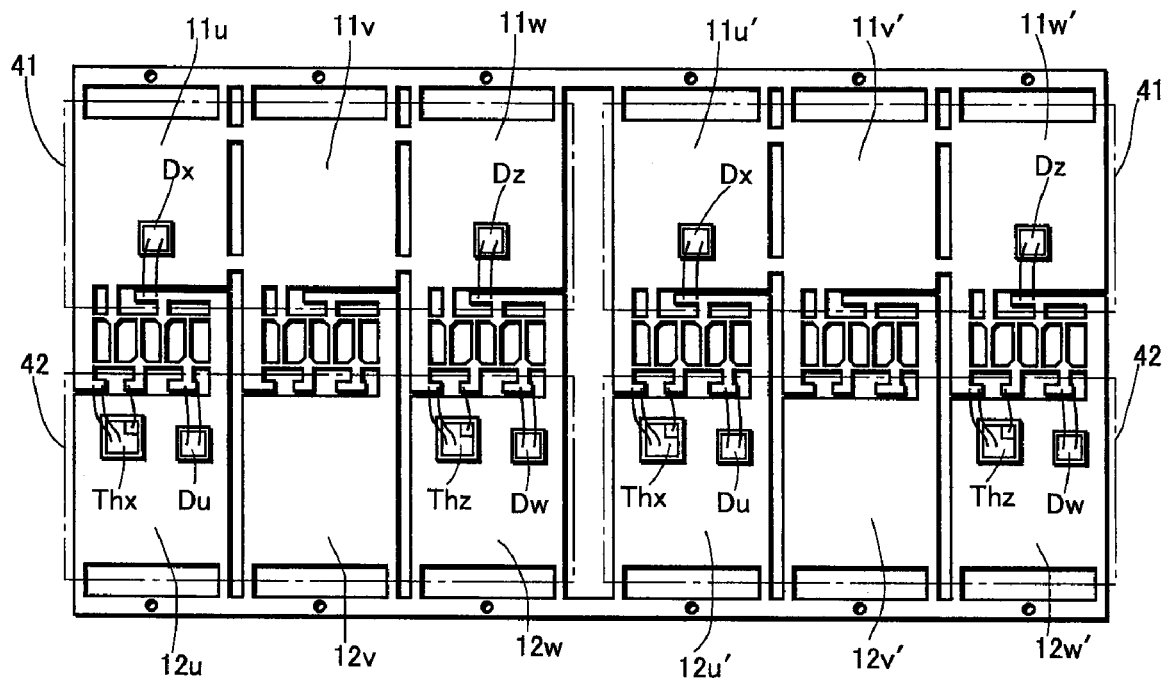
FIG. 11 is a front view illustrating a condition which semiconductor chips are mounted on a lead frame in another embodiment of the present invention.

For example, it is also possible to obtain a semiconductor device comprising a single-phase short-circuit type voltage regulator circuit to be connected to a single-phase magnetic AC generator using the same lead frame as is shown in the FIG. 11 by not mounting chips on second islands 11v and 11v' of a first group and on second islands 12v and 12v' of a second group, as illustrated in FIG. 11.

Figure 12:
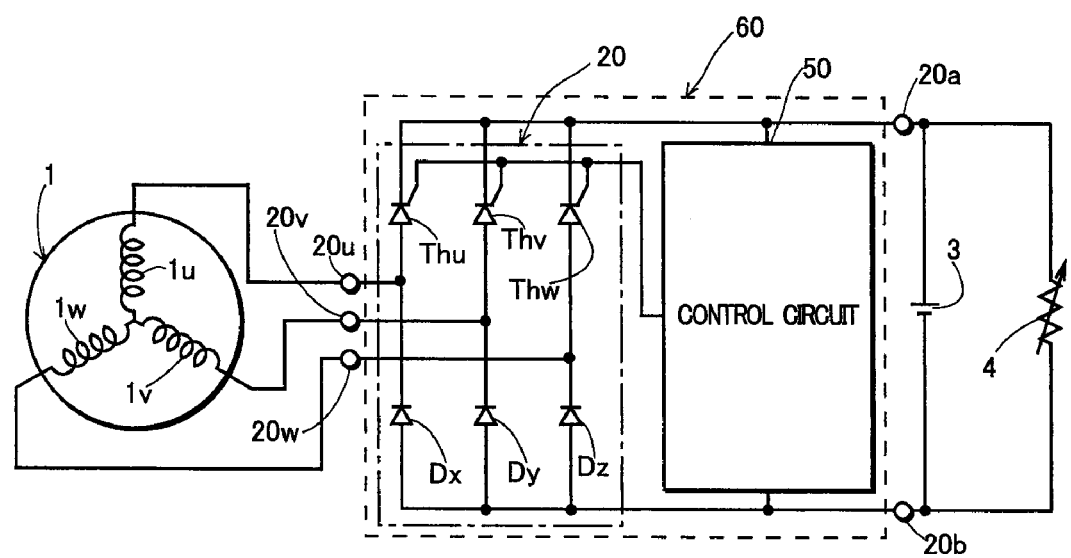
FIG. 12 is a circuit diagram illustrating the circuit construction of a semiconductor device in accordance with yet another embodiment of the present invention.

FIG. 12 is another example of the circuit construction of a semiconductor device in accordance with the present invention. In this example, the thyristors Thx to Thz shown in FIG. 1 are removed and, alternatively, the diodes Du to Dw shown in FIG. 1 are respectively replaced with thyristors Thu to Thw. A hybrid bridge rectifier circuit 20 is comprised of the thyristors Thu to Thw and the diodes Dx to Dz. 50 denotes a control circuit for controlling the thyristors Thu to Thw, where the control circuit detects a voltage developed across a battery 3, provides trigger signals to the thyristors Thu to Thw if the detected voltage is below a setpoint, and stops supplying the trigger signals to the thyristors Thu to Thw if the detected voltage exceeds the setpoint. The thyristors Thu to Thw turn on when provided with trigger signals and supply a charging current from a generator 1 to the battery 3. If the voltage developed across the battery exceeds the setpoint and a supply of trigger signals to the thyristors Thu to Thw is stopped, the thyristors Thu to Thw turn off the moment the respective anode currents thereof drop below a holding current, and stop supplying the charging current to the battery 3. A voltage regulator 60 is comprised of the hybrid bridge full-wave rectifier circuit 20 and the control circuit 50. In this example, semiconductor chips comprising the diodes Dx to Dz are a first group of semiconductor chips and semiconductor chips comprising the thyristors Thu to Thw are a second group of semiconductor chips.

Figure 13:
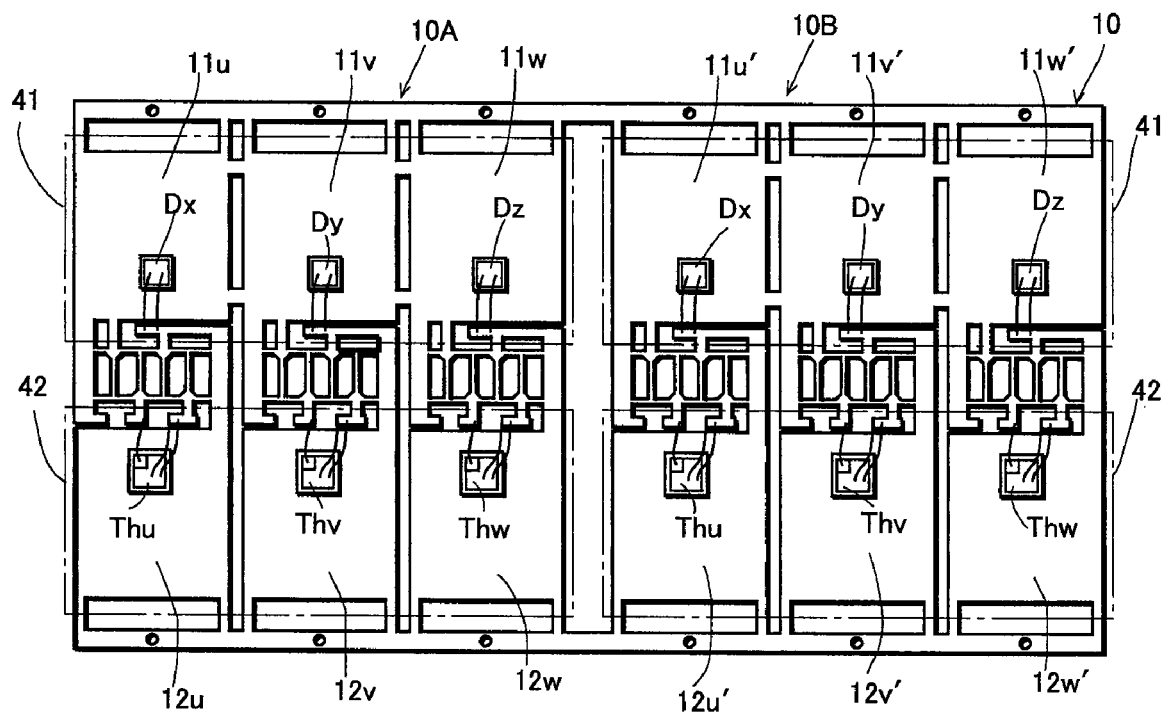
FIG. 13 is a front view illustrating a condition where semiconductor chips are mounted on a lead frame in the process of manufacturing a semiconductor device having the circuit construction shown in FIG. 12.

When comprising the circuit illustrated in FIG. 12, the diodes Dx to Dz are respectively mounted on the islands 11u to 11w of a first group provided in the first half portion 10A of a lead frame 10 and the thyristors Thu to Thw are respectively mounted on the islands 12u to 12w of a second group, as illustrated in FIG. 13. In addition, the diodes Dx to Dz are respectively mounted on the islands 11u' to 11w' of a first group provided in the second half portion 10B of the lead frame 10 and the thyristors Thu to Thw are respectively mounted on the islands 12u' to 12w' of a second group. The way a first resin-seal portion 41 and a second resin-seal portion 42 are provided is the same as described in the above-cited embodiment.

Figure 14:
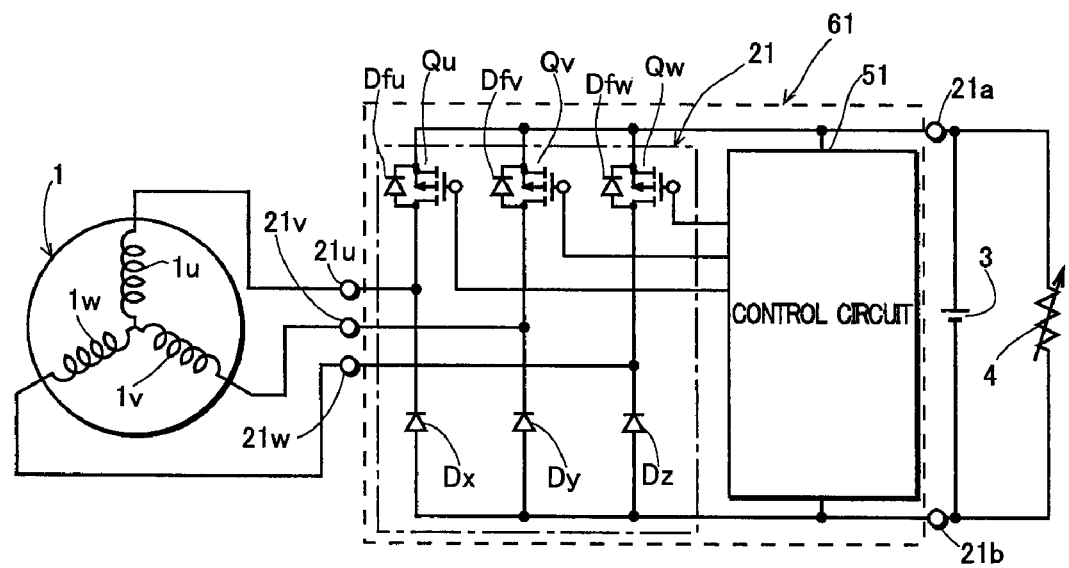
FIG. 14 is a circuit diagram illustrating the circuit construction of a semiconductor device in accordance with still another embodiment of the present invention.

FIG. 14 is yet another example of the circuit construction of a semiconductor device in accordance with the present invention. In this example, the thyristors Thx to Thz shown in FIG. 1 are removed and, alternatively, the diodes Du to Dw shown in FIG. 1 are respectively replaced with MOSFETs Qu to Qw. As the MOSFETs, those of p-channel type are used, where the sources of the MOSFETs Qu to Qw are connected to a positive output terminal 21a and the drains of the MOSFETs Qu to Qw are respectively connected to diodes Dx to Dz. The anodes of the diodes Dx to Dz are connected to a negative output terminal 21b and the MOSFETs Qu to Qw and the diodes Dx to Dz comprise a control rectifier circuit 21. In this control rectifier circuit, a full-wave rectifier circuit is comprised of parasitic diodes Dfu to Dfw formed between the drains and sources of the MOSFETs Qu to Qw and diodes Dx to Dz. In this example, semiconductor chips comprising the diodes Dx to Dz are a first group of semiconductor chips and semiconductor chips comprising the MOSFETs Qu to Qw are a second group of semiconductor chips.

A reference numeral 51 denotes a control circuit for controlling the MOSFETs Qu to Qw, where the control circuit detects a voltage developed across a battery 3 and maintains the MOSFETs Qu to Qw in an off state if the detected voltage is below a setpoint. At this point, the output of a generator 1 is rectified by a full-wave rectifier circuit comprised of parasitic diodes Dfu to Dfw formed between the drains and sources of the MOSFETs Qu to Qw and diodes Dx to Dz and is supplied to the battery 3. In addition, the control circuit 51 provides driving signals to the MOSFETs Qu to Qw and simultaneously turn on these MOSFETs if the voltage developed across the battery 3 exceeds the setpoint, short-circuits the output of the generator 1 through one of the diodes Dfu to Dfw comprising the upper side of a bridge and the on-state MOSFETs, and stops supplying a driving current to the battery 3. In this example, a voltage regulator 61 is comprised of the control rectifier circuit 21 and the control circuit 51.

Figure 15:
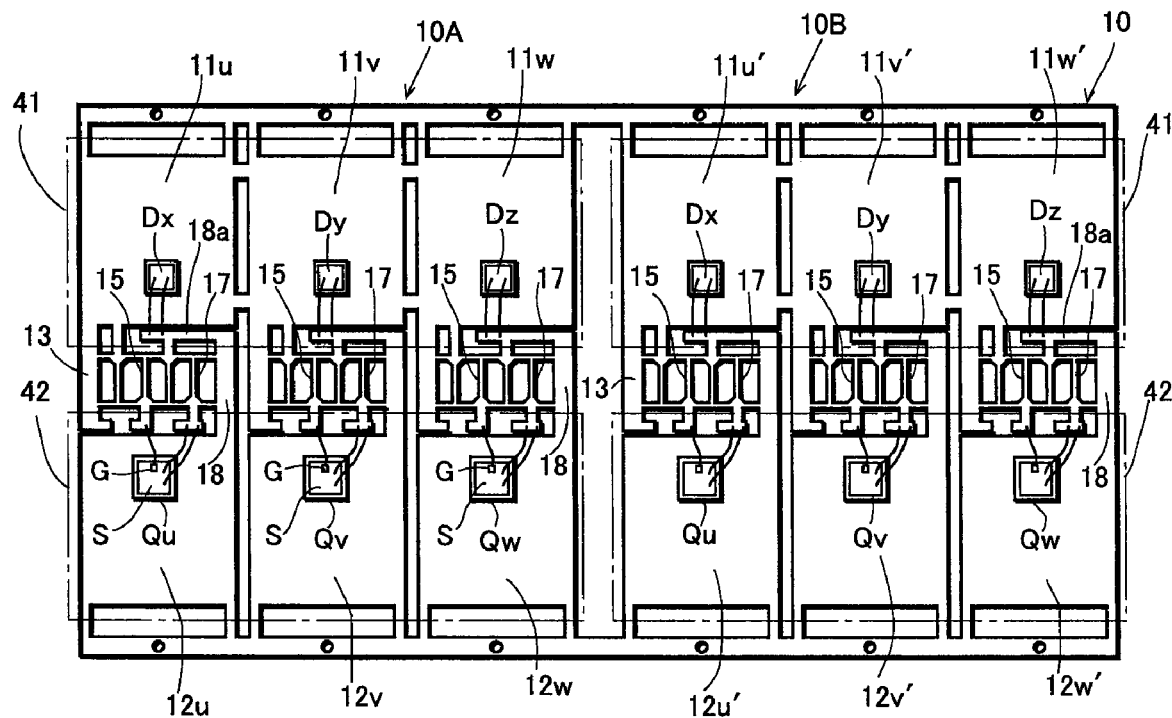
FIG. 15 is a front view illustrating a condition where semiconductor chips are mounted on a lead frame in the process of manufacturing a semiconductor device having the circuit construction shown in FIG. 14.

When comprising the circuit illustrated in FIG. 14, the diodes Dx to Dz are respectively mounted on the islands 11u to 11w of a first group provided in the first half portion 10A of a lead frame 10 and the MOSFETs Qu to Qw are respectively mounted on the islands 12u to 12w of a second group, as illustrated in FIG. 15. As the MOSFETs Qu to Qw, those having drains on one side and sources and gates on the other side are used, where the respective drains of the MOSFETs are soldered to the islands 12u to 12w. In addition, the respective sources S of the MOSFETs Qu to Qw are connected to corresponding leads 17 through wires and the gates G of the MOSFETs are connected to corresponding leads 15. Likewise, the diodes Dx to Dz are respectively mounted on the islands 11u' to 11w' of a first group provided in the second half portion 10B of the lead frame 10 and the MOSFETs Qu to Qw are respectively mounted on the islands 12u' to 12w' of a second group. The rest of the circuit construction is the same as those of the embodiments illustrated in FIGS. 1 to 7. The sources of the MOSFETs Qu to Qw are connected in common to the positive output terminal through a wiring pattern provided on a circuit board when the semiconductor device of the present embodiment is mounted on the circuit board.

Figure 16:
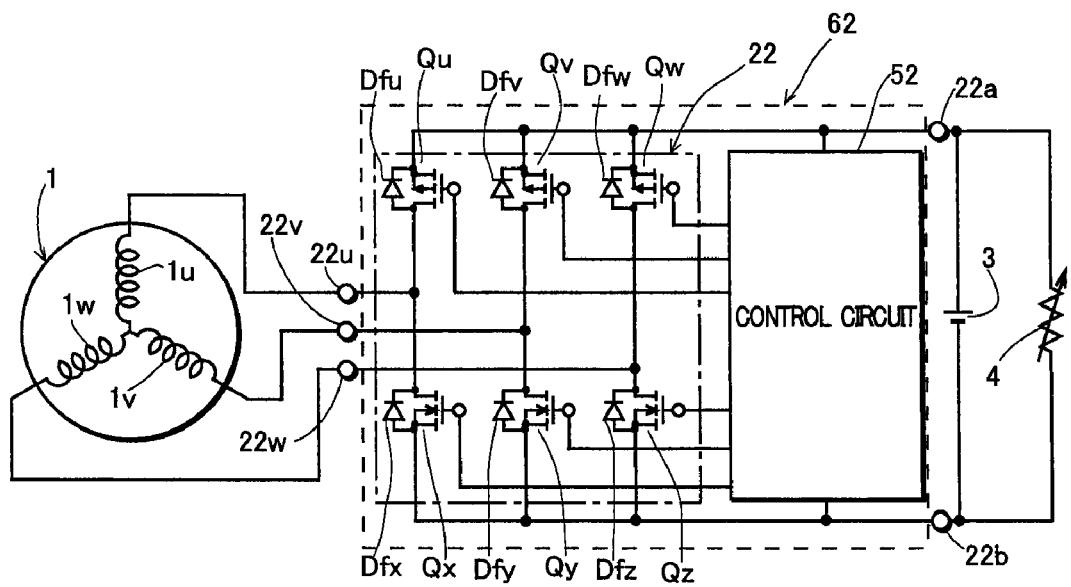
FIG. 16 is a circuit diagram illustrating the circuit construction of a semiconductor device in accordance with still another embodiment of the present invention.

FIG. 16 is still another example of the circuit construction of a semiconductor device in accordance with the present invention. In the figure, 22 denotes an inverter circuit having DC-side terminals 22a and 22b whereto a battery 3 and a load 4 are connected and AC-side terminals 22u to 22w whereto the three-phase output terminals of a magnetic generator 1 are connected and 52 denotes a control circuit for controlling the inverter circuit. The inverter circuit 22 is comprised of a known bridge-type circuit, where the upper side of the bridge circuit is comprised of P-channel MOSFETs Qu to Qw and the lower side is comprised of N-channel MOSFETs Qx to Qz the drains of which are respectively connected to the drains of the MOSFETs Qu to Qw. In the illustrated example, parasitic diodes Dfu to Dfw formed between the drains and sources of the MOSFETs Qu to Qw and parasitic diodes Dfx to Dfz formed between the drains and sources of the MOSFETs Qx to Qz comprise a diode bridge full-wave rectifier circuit for rectifying the output of the magnetic AC generator 1 and supplying the output to the battery 3. In this example, semiconductor chips comprising the diodes Dx to Dz are a first group of semiconductor chips and semiconductor chips comprising the MOSFETs Qu to Qw are a second group of semiconductor chips.

The control circuit 52 converts the output voltage of the battery 3 to an AC control voltage the frequency of which is equal to the output frequency of the magnetic AC generator 1 and which has a predetermined phase angle against the phase of the no-load output voltage of the generator, and applies the AC control voltage to the armature coils 1u to 1w of the magnetic AC generator 1, in order to control the output of the magnetic AC generator 1. Since the output of the generator varies according to a change in the phase of the AC control voltage when the AC control voltage is applied to the armature coils of the magnetic AC generator 1, it is possible to control the output of the generator so as to maintain the voltage developed across the battery within a preset range by varying the phase of the AC control voltage to be applied to the generator 1 through the inverter circuit 22 according to a voltage developed across the battery 3 (i.e., the voltage developed across the load 4). In this example, a generator output control device 62 for controlling the output of the generator 1 is comprised of the inverter circuit 22 and the control circuit 52.

Figure 17:
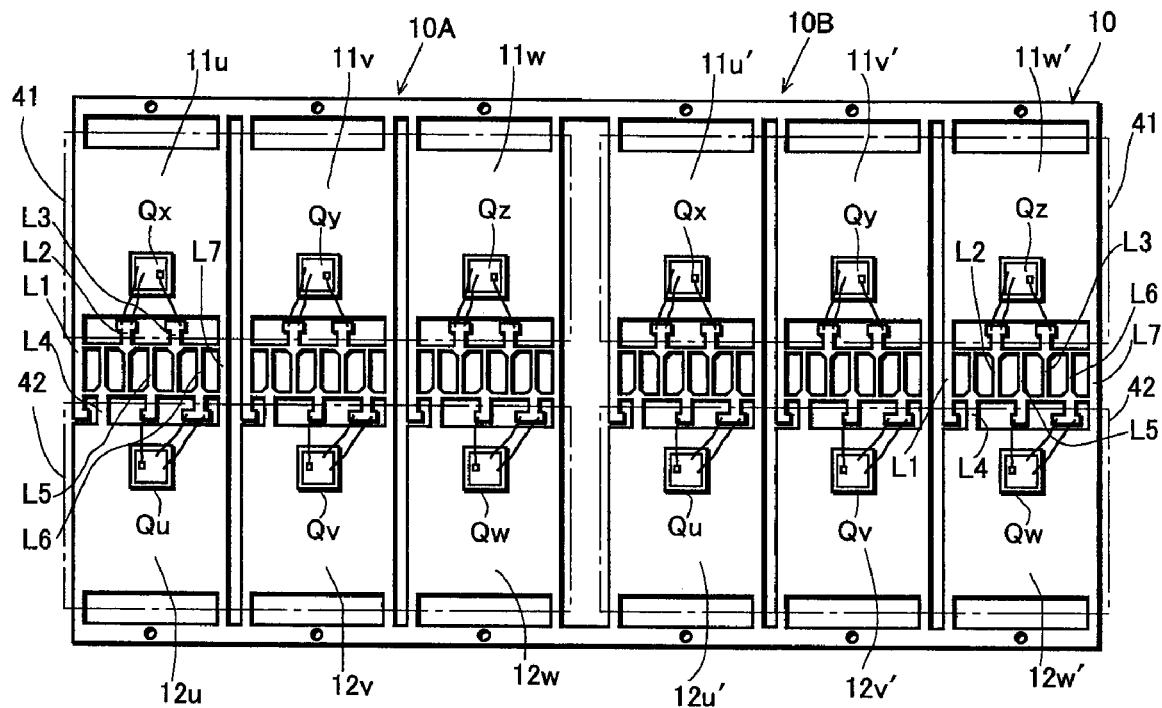
FIG. 17 is a front view illustrating a condition where semiconductor chips are mounted on a lead frame in the process of manufacturing a semiconductor device having the circuit construction shown in FIG. 16.

When comprising the circuit illustrated in FIG. 16, the disposition pattern of a group of leads to be provided between the first group of islands and the second group of islands of a lead frame 10 is changed, for example, as illustrated in FIG. 17. In the example illustrated in FIG. 17, leads L1 to L3 are provided for a first group of islands 11u to 11w and islands 11u' to 11w' and the leads L1, among these leads, are connected to the first group of islands. Likewise, leads L4 to L6 are provided for a second group of islands 12u to 12w and islands 12u' to 12w' and the leads L4, among these leads, are connected to the second group of islands. In addition, as leads common to the first and second groups of islands, there are provided leads L7 for connecting between the first and second groups of islands.

In the example illustrated in FIG. 17, the N-channel MOSFETs Qx to Qz are respectively mounted on the islands 11u to 11w of the first group provided in the first half portion 10A of the lead frame 10 and the P-channel MOSFETs Qu to Qw are respectively mounted on the islands 12u to 12w of the second group. As the N-channel MOSFETs Qx to Qz, chips each having a drain on one side and a source and a gate on the other side are used, where the drains of the respective MOSFETs are soldered to the islands 11u to 11w. The sources of the MOSFETs Qx to Qz are connected to corresponding leads L2 through wires and the gates of the MOSFETs Qx to Qz are connected to corresponding leads L3 through wires.

Also as the P-channel MOSFETs Qu to Qw, chips each having a drain on one side and a source and a gate on the other side are used, where the drains of the respective MOSFETs are soldered to the islands 12u to 12w. In addition, the sources S of the MOSFETs Qu to Qw are connected to corresponding leads L6 through wires and the gates G of the MOSFETs Qu to Qw are connected to corresponding leads L5 through wires.

Likewise, the N-channel MOSFETs Qx to Qz are respectively mounted on the islands 11u' to 11w' of the first group provided in the second half portion 10B and the P-channel MOSFETs Qu to Qw are respectively mounted on the islands 12u to 12w of the second group. The rest of the circuit construction is the same as those of the embodiments illustrated in FIGS. 1 to 7, where a first resin-seal portion 41 is provided so as to cover the first group islands of each half portion of the lead frame, the semiconductor chips mounted on the first group of islands, the inner lead portions of the leads L1, L2 and L3, and one end of each lead L7 (end on the side of the first group of islands). In addition, a second resin-seal portion 42 is provided so as to cover the second group islands of each half portion of the lead frame, the semiconductor chips mounted on the second group of islands, the front ends of the leads L1, the inner lead portions of the leads L5 and L6, and the other end of each lead L7. The sources of the MOSFETs Qu to Qw are connected in common to the positive DC-side terminal 22a through the leads L6 and a wiring pattern provided on a circuit board when the semiconductor device of the present embodiment is mounted on the circuit board, and the sources of the MOSFETs Qx to Qz are connected in common to the negative DC-side terminal 22b through the leads L2 and a wiring pattern provided on the circuit board. In addition, three leads L4 respectively connected to the islands 12u to 12w are connected to the three-phase AC-side terminals 22u to 22w though a predetermined wiring pattern provided in the circuit board.

Whereas in the description made above, the circuit illustrated in FIG. 16 has been referred to as a circuit comprising the control circuit for controlling the output of the magnetic AC generator 1, the same circuit construction as illustrated in FIG. 16 is employed also in a case where a three-phase brushless motor is driven by a battery output through an inverter circuit. Consequently, the present invention is also applicable to a semiconductor device comprising a circuit for driving a brushless motor.

Although preferred embodiments of the present invention have been described hereinabove, the number of islands, the number of leads and the array patterns thereof to be provided in a lead frame are not limited to those described in the above-cited embodiments but are varied as necessary according to the construction of a circuit within a semiconductor device. The present invention is not limited either to a case where power semiconductor chips are used as described in each above-cited embodiment, but is also applicable, as a matter of course, to a semiconductor device which is comprised using semiconductor chips having a relatively small current-carrying capacity.

Although in the above-described embodiment, there is used a lead frame in which both the number of first group islands and the number of second group islands are defined as three, in the present invention it is possible in general to use a lead frame having a structure in which a first group of first to "n"th ("n" is an integer greater than or equal to 1) islands arranged on one end of a lead frame in its width direction in an array in the longitudinal direction of the lead frame are provided, a second group of first to "m"th ("m" is an integer greater than or equal to 1) islands arranged on the other end of the lead frame in its width direction in an array in the longitudinal direction of a lead frame are provided, and a group of leads including a plurality of leads corresponding to each island are provided between the first and second groups of islands. The above-mentioned numerals "m" and "n" may be or may not be equal to each other.

Although in each of the above-cited embodiments, there has been taken as an example the case where a lead frame for manufacturing two semiconductor devices at a time is used, it is needless to say that the present invention is also applicable to a case where a lead frame for manufacturing one semiconductor device or three or more semiconductor devices at a time is used.

Although in each of the above-cited embodiments, the semiconductor chip is arranged at a position proximate to the lead-side end of an island, in order to shorten wires for connecting between each semiconductor chip and predetermined leads as much as possible, the present invention is not limited to a case where semiconductor chips are mounted as described above and, accordingly, each semiconductor chip may be mounted in the center of an island. If each semiconductor chip is mounted in the center of an island it is possible to enhance the performance of radiation from the semiconductor chip, though wires for connecting between each semiconductor chip and leads become longer.

As heretofore described, according to the present invention, it is possible to suppress a temperature rise in a semiconductor device by reducing the number of semiconductor chips to be buried in one resin-seal portion since a plurality of semiconductor chips comprising a predetermined semiconductor device are divided into two groups and both groups of semiconductor chips are covered with separate resin-seal portions. Consequently, the present invention is particularly suited to a semiconductor device comprising a power-handling circuit, such as a rectifier circuit, a short-circuit type voltage regulator circuit, an inverter circuit, and the like. However, the present invention is not limited to a semiconductor device comprising a power-handling circuit but is widely applicable to a semiconductor device which is comprised using a plurality of semiconductor chips.

What is claimed is:

1. A semiconductor device in which a plurality of semiconductor chips are mounted on a lead frame and seal portions are provided so as to cover said plurality of semiconductor chips and required portions of said lead frame to be covered, said plurality of semiconductor chips being divided into a first group of semiconductor chips and a second group of semiconductor chips wherein both groups of semiconductor chips are respectively mounted on one and the other sides of said lead frame in its width direction at a distance from each other, said seal portions being comprised of first and second resin-seal portions wherein said first and second groups of semiconductor chips are respectively covered along with the required portions of said lead frame to be covered, said first and second resin-seal portions being mechanically coupled with each other by coupling portions, wherein a gap is formed between said first and second resin-seal portions and the outer lead portions of leads connected to circuits within said first resin-seal portion and the outer lead portions of leads connected to circuits within said second resin-seal portion are drawn out through said gap between said first and second resin-seal portions as lead terminals, a plurality of leads that form part of said lead frame comprises said coupling portions, wherein both ends of each of said plurality of leads comprising said coupling portions are buried in said first resin-seal portion and in said second resin-seal portion, and coupling resin-molded portions which cover said plurality of leads comprising said coupling portions are formed so as to bridge said first resin-seal portion and said second resin-seal portion so that said first and second resin-sealed portions are mechanically coupled with each other also by said coupling resin-seal portions.

2. A semiconductor device in which a plurality of semiconductor chips are mounted on a lead frame and seal portions are provided so as to cover said plurality of semiconductor chips and required portions of said lead frame to be covered, said lead frame including a first group of first to "n"th ("n" is an integer greater than or equal to 1) islands arranged on one end of said lead frame in its width direction in an array in the longitudinal direction of said lead frame and a second group of first to "m"th ("m" is an integer greater than or equal to 1) islands arranged on the other end of said lead frame in its width direction in an array in the longitudinal direction of said lead frame, wherein a group of leads including leads corresponding to each island are arranged in a space formed between said first group of islands and said second group of islands, said plurality of semiconductor chips being divided into a first group and a second group, wherein said first and second groups of semiconductor chips are respectively mounted on the islands of said lead frame belonging to said first group of islands and on the islands of said lead frame belonging to said second group of islands and each semiconductor chip mounted on each island and predetermined leads corresponding to each island are connected to each other through wires, said seal portions being comprised of a first resin-seal portion which covers said first group of semiconductor chips, the islands of said lead frame belonging to said first group of islands and the inner lead portions of leads corresponding to each island belonging to said first group of islands and of a second resin-seal portion which covers said second group of semiconductor chips, the islands of said lead frame belonging to said second group of islands and the inner lead portions of leads corresponding to each island belonging to said second group of islands, and said first resin-seal portion and said second resin-seal portion being mechanically coupled with each other by coupling portions, wherein a gap is formed between said first resin-seal portion and said second resin-seal portion and the outer lead portions of leads to be connected to an external circuit, among said plurality of leads, are drawn out through said gap between said first resin-seal portion and said second resin-seal portion as lead terminals, a plurality of leads that form part of said lead frame comprises said coupling portions, wherein both ends of each of said plurality of leads comprising said coupling portions are buried in said first resin-seal portion and in said second resin-seal portion, and coupling resin-molded portions which cover said plurality of leads comprising said coupling portions are formed so as to bridge said first resin-seal portion and said second resin-seal portion so that said first and second resin-sealed portions are mechanically coupled with each other also by said coupling resin-seal portions.

3. A semiconductor device in which a plurality of semiconductor chips are mounted on a lead frame and seal portions are provided so as to cover said plurality of semiconductor chips and required portions of said lead frame to be covered, said lead frame including a first group of first to "n"th ("n" is an integer greater than or equal to 1) islands arranged on one end of said lead frame in its width direction in an array in the longitudinal direction of said lead frame and a second group of first to "n"th islands provided on the other end of said lead frame in its width direction so as to respectively pair with said first group of first to "n"th islands, said first and second groups of paired islands being arranged in the width direction of said lead frame at a distance from each other so as to face to each other, wherein a plurality of leads corresponding to each paired islands are arranged in a space formed between said first and second groups of paired islands, said plurality of semiconductor chips being divided into a first group and a second group, wherein first and second groups of semiconductor chips are respectively mounted on the islands of said lead frame belonging to said first group of islands and on the islands of said lead frame belonging to said second group of islands and a semiconductor chip mounted on each island and predetermined leads corresponding to each island are connected to each other through wires, said seal portions being comprised of a first resin-seal portion which covers said first group of semiconductor chips, the islands of said lead frame belonging to said first group of islands and the inner lead portions of leads corresponding to each island belonging to said first group of islands and of a second resin-seal portion which covers said second group of semiconductor chips, the islands of said lead frame belonging to said second group of islands and the inner lead portions of leads corresponding to each island belonging to said second group of islands, and said first resin-seal portion and said second resin-seal portion being mechanically coupled with each other by coupling portions, wherein a gap is formed between said first resin-seal portion and said second resin-seal portion, and the outer lead portions of leads to be connected to an external circuit, among said plurality of leads, are drawn out through said gap between said first resin-seal portion and said second resin-seal portion as lead terminals, a plurality of leads that form part of said lead frame comprises said coupling portions, wherein both ends of each of said plurality of leads comprising said coupling portions are buried in said first resin-seal portion and in said second resin-seal portion, and coupling resin-molded portions which cover said plurality of leads comprising said coupling portions are formed so as to bridge said first resin-seal portion and said second resin-seal portion so that said first and second resin-seal portions are mechanically coupled with each other also by said coupling resin-seal portions.

4. A semiconductor device in which a plurality of semiconductor chips are mounted on a lead frame and seal portions are provided so as to cover said plurality of semiconductor chips and required portions of said lead frame to be covered, said lead frame including a first group of first to third islands arranged on one end of said lead frame in its width direction in an array in the longitudinal direction of said lead frame and a second group of first to third islands arranged on the other end of said lead frame in its width direction so as to respectively pair with said first group of first to third islands, said first and second groups of paired islands being arranged in the width direction of said lead frame at a distance from each other so as to face to each other, wherein a plurality of leads corresponding to each paired islands are arranged in a space formed between said first and second groups of paired islands, said plurality of semiconductor chips including first to third diodes, fourth to sixth diodes the anodes thereof being connected in common and the cathodes thereof being respectively connected to the anodes of said first to third diodes, thereby comprising a diode bridge three-phase full-wave rectifier circuit in conjunction with said first to third diodes, and first to third thyristors respectively connected in reverse parallel to said fourth to sixth diodes and simultaneously triggered when the input terminals of said rectifier circuit are short-circuited in order to regulate the output voltage of said rectifier circuit, said first to third diodes being mounted with the respective anodes thereof directly connected to said second group of first to third islands of said lead frame, said fourth to sixth diodes being mounted with the respective anodes thereof directly connected to said first group of first to third islands of said lead frame, said first to third thyristors being mounted with the respective anodes thereof directly connected to said second group of first to third islands, wherein semiconductor chips mounted on respective islands respectively belonging to said first group and said second group and predetermined leads corresponding to each island are connected to each other through wires, said seal portions being comprised of a first resin-seal portion which covers said first group of first to third islands, semiconductor chips mounted on these islands, and the inner lead portions of leads corresponding to said respective islands belonging to said first group and of a second resin-seal portion which covers said second group of first to third islands, semiconductor chips mounted on these islands, and the inner lead portions of leads corresponding to said respective islands belonging to said second group, and said first resin-seal portion and said second resin-seal portion being mechanically coupled with each other by coupling portions, wherein a gap is formed between said first resin-seal portion and said second resin-seal portion and the outer lead portions of leads to be connected to an external circuit, among said plurality of leads, are drawn out through said gap between said first resin-seal portion and said second resin-seal portion as lead terminals, a plurality of leads that form part of said lead frame comprises said coupling portions, wherein both ends of each of said plurality of leads comprising said coupling portions are buried in said first resin-seal portion and in said second resin-seal portion, and coupling resin-molded portions which cover said plurality of leads comprising said coupling portions are formed so as to bridge said first resin-seal portion and said second resin-seal portion so that said first and second resin-sealed portions are mechanically coupled with each other also by said coupling resin-seal portions.

* * * * *